(12) United States Patent
Rajashekhar et al.

(10) Patent No.: US 12,342,537 B2
(45) Date of Patent: Jun. 24, 2025

(54) THREE-DIMENSIONAL MEMORY DEVICE CONTAINING EPITAXIAL PEDESTALS AND TOP SOURCE CONTACT

(71) Applicant: SANDISK TECHNOLOGIES LLC, Addison, TX (US)

(72) Inventors: Adarsh Rajashekhar, Santa Clara, CA (US); Raghuveer S. Makala, Campbell, CA (US); Masanori Tsutsumi, Yokkaichi (JP); Fei Zhou, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 598 days.

(21) Appl. No.: 17/655,272

(22) Filed: Mar. 17, 2022

(65) Prior Publication Data
US 2023/0301077 A1    Sep. 21, 2023

(51) Int. Cl.
*H10B 41/27*  (2023.01)
*G11C 16/04*  (2006.01)
(Continued)

(52) U.S. Cl.
CPC ......... *H10B 41/27* (2023.02); *G11C 16/0483* (2013.01); *H10B 41/10* (2023.02);
(Continued)

(58) Field of Classification Search
CPC ........ H10B 41/35; H10B 43/35; H10B 41/27; H10B 43/27; H10B 41/20
(Continued)

(56) References Cited

U.S. PATENT DOCUMENTS 9,230,980 B2   1/2016   Rabkin et al.
9,530,785 B1   12/2016  Koka et al.
(Continued)

OTHER PUBLICATIONS

U.S. Appl. No. 16/951,325, filed Nov. 18, 2020, SanDisk Technologies LLC.
(Continued)

*Primary Examiner* — Eliseo Ramos Feliciano
*Assistant Examiner* — Mikka Liu
(74) *Attorney, Agent, or Firm* — THE MARBURY LAW GROUP PLLC

(57) ABSTRACT

A semiconductor structure includes a doped single crystalline semiconductor material layer, a metal or metal alloy source contact layer located over a back side of the doped single crystalline semiconductor material layer, a dielectric isolation layer located over a front side of the doped single crystalline semiconductor material layer, an alternating stack of insulating layers and electrically conductive layers located over the dielectric isolation layer, a memory opening vertically extending through the alternating stack and the dielectric isolation layer and at least partially through the doped single crystalline semiconductor material layer, a memory film and a vertical semiconductor channel located within the memory opening, such that the vertical semiconductor channel vertically extends through the dielectric isolation layer and into the doped single crystalline semiconductor material layer, and a single crystalline semiconductor pedestal contacting the doped single crystalline semiconductor material layer and the vertical semiconductor channel.

14 Claims, 32 Drawing Sheets

(51) Int. Cl.
 *H10B 41/10* (2023.01)
 *H10B 41/35* (2023.01)
 *H10B 41/40* (2023.01)
 *H10B 43/10* (2023.01)
 *H10B 43/27* (2023.01)
 *H10B 43/35* (2023.01)
 *H10B 43/40* (2023.01)

(52) U.S. Cl.
 CPC ............ *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(58) Field of Classification Search
 USPC ........................................................ 257/314
 See application file for complete search history.

(56) References Cited

U.S. PATENT DOCUMENTS

| | | | |
|---|---|---|---|
| 9,627,395 B2 | 4/2017 | Zhang et al. | |
| 9,721,663 B1* | 8/2017 | Ogawa | H10B 43/27 |
| 9,870,945 B2 | 1/2018 | Pachamuthu et al. | |
| 10,121,794 B2 | 11/2018 | Gunji-Yoneoka et al. | |
| 10,629,616 B1 | 4/2020 | Kai et al. | |
| 10,748,925 B1 | 8/2020 | Tsutsumi et al. | |
| 10,790,300 B2 | 9/2020 | Rajashekhar et al. | |
| 10,804,291 B1 | 10/2020 | Rajashekhar et al. | |
| 10,833,101 B2 | 11/2020 | Shimomura et al. | |
| 10,868,025 B2 | 12/2020 | Zhou et al. | |
| 10,964,715 B2 | 3/2021 | Kakazu et al. | |
| 10,991,705 B2 | 4/2021 | Nishikawa et al. | |
| 10,991,706 B2 | 4/2021 | Nishikawa et al. | |
| 10,991,718 B2 | 4/2021 | Pachamuthu et al. | |
| 11,024,645 B2 | 6/2021 | Moriyama et al. | |
| 11,049,880 B2 | 6/2021 | Rajashekhar et al. | |
| 11,171,150 B2 | 11/2021 | Yuda et al. | |
| 11,195,781 B2 | 12/2021 | Okina et al. | |
| 11,201,107 B2 | 12/2021 | Okina et al. | |
| 2015/0076586 A1 | 3/2015 | Rabkin et al. | |
| 2016/0268209 A1 | 9/2016 | Pachamuthu et al. | |
| 2017/0365613 A1 | 12/2017 | Gunji-Yoneoka et al. | |
| 2018/0151497 A1* | 5/2018 | Makala | H01L 21/76805 |
| 2018/0374865 A1* | 12/2018 | Shimabukuro | H10D 30/693 |
| 2019/0221557 A1* | 7/2019 | Kim | H01L 24/80 |
| 2019/0229125 A1* | 7/2019 | Zhou | H10B 41/27 |
| 2020/0251486 A1 | 8/2020 | Tsutsumi et al. | |
| 2021/0035965 A1 | 2/2021 | Mizutani et al. | |
| 2021/0036003 A1 | 2/2021 | Pachamuthu et al. | |
| 2021/0091063 A1 | 3/2021 | Ninomiya et al. | |
| 2021/0358931 A1 | 11/2021 | Makala et al. | |
| 2021/0358952 A1 | 11/2021 | Makala et al. | |
| 2021/0408031 A1 | 12/2021 | Sharangpani et al. | |

OTHER PUBLICATIONS

U.S. Appl. No. 16/951,354, filed Nov. 18, 2020, SanDisk Technologies LLC.
U.S. Appl. No. 17/082,629, filed Oct. 28, 2020, SanDisk Technologies LLC.
U.S. Appl. No. 17/122,296, filed Dec. 15, 2020, SanDisk Technologies LLC.
U.S. Appl. No. 17/134,997, filed Dec. 28, 2020, SanDisk Technologies LLC.
U.S. Appl. No. 17/232,209, filed Apr. 16, 2021, SanDisk Technologies LLC.
U.S. Appl. No. 17/577,533, filed Jan. 18, 2022, SanDisk Technologies LLC.
U.S. Appl. No. 17/684,975, filed Mar. 2, 2022, SanDisk Technologies LLC.

* cited by examiner

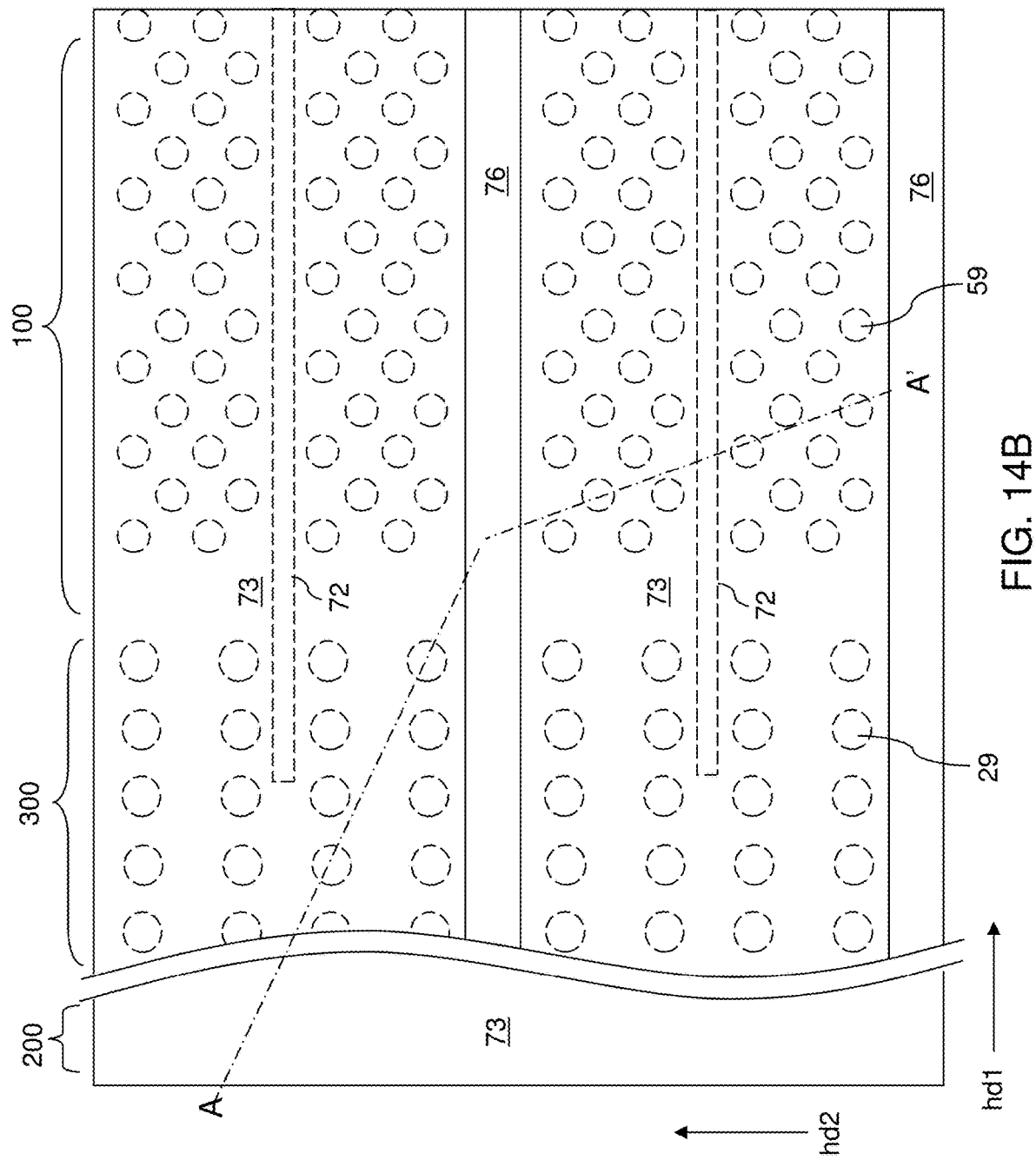

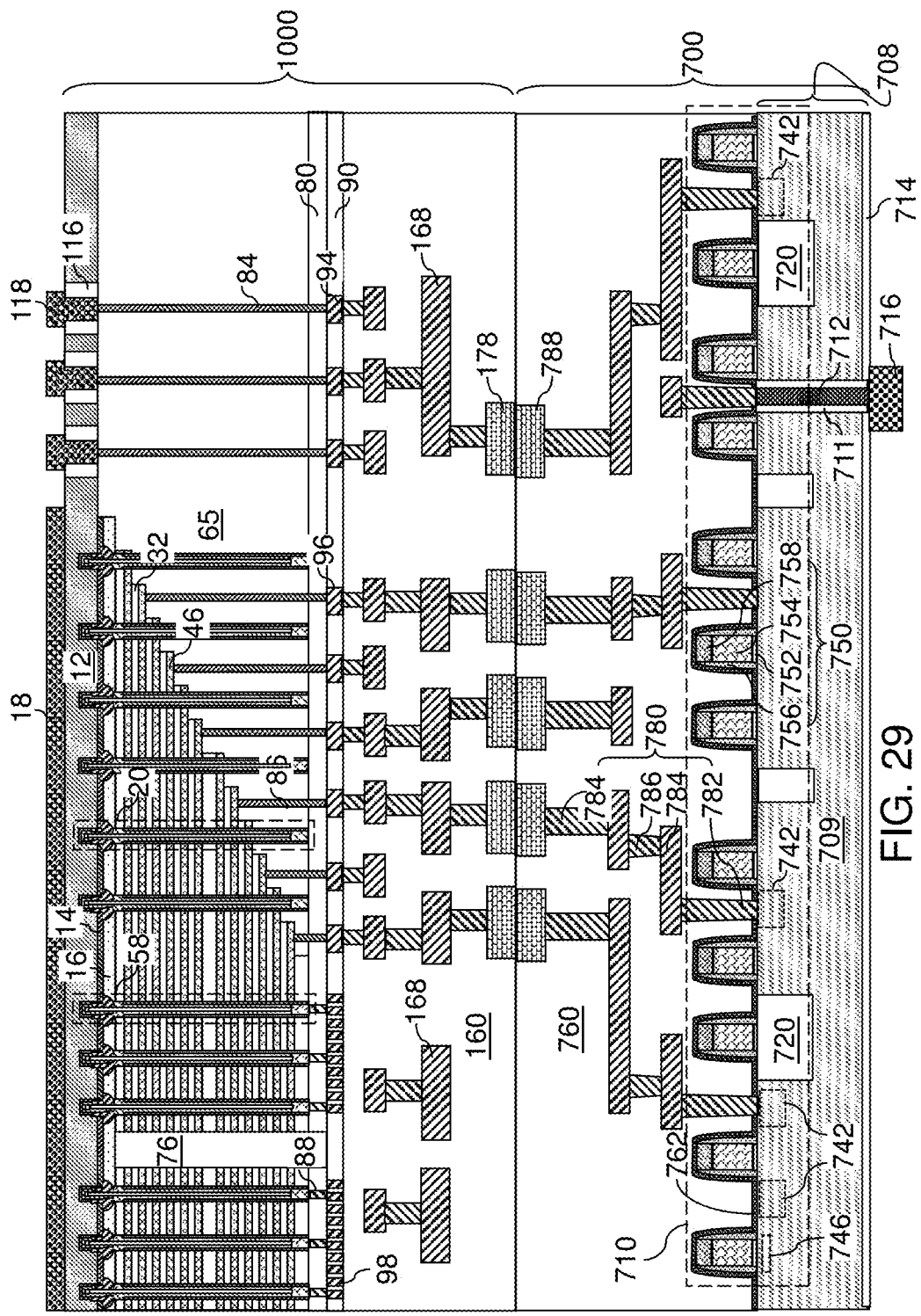

THREE-DIMENSIONAL MEMORY DEVICE CONTAINING EPITAXIAL PEDESTALS AND TOP SOURCE CONTACT

FIELD

The present disclosure relates generally to the field of semiconductor devices, and particularly to a three-dimensional memory device containing epitaxial pedestals and top source contact and methods for making the same.

BACKGROUND

Support circuitry for performing write, read, and erase operations of the memory cells in the vertical NAND strings may be are provided by complementary metal oxide semiconductor (CMOS) devices formed on a same substrate as the three-dimensional memory device containing the NAND strings

SUMMARY

According to an aspect of the present disclosure, a semiconductor structure includes a doped single crystalline semiconductor material layer, a metal or metal alloy source contact layer located over a back side of the doped single crystalline semiconductor material layer, a dielectric isolation layer located over a front side of the doped single crystalline semiconductor material layer, an alternating stack of insulating layers and electrically conductive layers located over the dielectric isolation layer, a memory opening vertically extending through the alternating stack and the dielectric isolation layer and at least partially through the doped single crystalline semiconductor material layer, a memory film and a vertical semiconductor channel located within the memory opening, such that the vertical semiconductor channel vertically extends through the dielectric isolation layer and into the doped single crystalline semiconductor material layer, and a single crystalline semiconductor pedestal contacting the doped single crystalline semiconductor material layer and the vertical semiconductor channel.

According to another aspect of the present disclosure, a method of forming a three-dimensional memory device comprises forming a disposable material layer and an alternating stack of insulating layers and spacer material layers over a doped single crystalline semiconductor material layer located over a carrier substrate, wherein the spacer material layers are formed as, or are subsequently replaced with, electrically conductive layers, forming a memory opening through the alternating stack and the disposable material layer, and into an upper portion of the doped single crystalline semiconductor material layer, forming a sacrificial memory opening fill structure including a memory film in the memory opening, forming a laterally-extending cavity by removing the disposable material layer selective to materials of the alternating stack and without removing the doped single crystalline semiconductor material layer, isotropically etching portions of the memory film that are proximal to the laterally-extending cavity, such that a cylindrical surface segment of the doped single crystalline semiconductor material layer is physically exposed around a bottom portion of the sacrificial memory opening fill structure, performing a selective epitaxy process that grows an epitaxial semiconductor material from the cylindrical surface segment of the doped single crystalline semiconductor material layer, and replacing the sacrificial memory opening fill structure with a memory opening fill structure including a vertical semiconductor channel that contacts the memory film and the epitaxial semiconductor material.

BRIEF DESCRIPTION OF THE DRAWINGS

FIG. 14B is a top-down view of the first exemplary structure of FIG. 14A. The vertical plane A-A' is the plane of the schematic vertical cross-sectional view of FIG. 14A.

FIG. 29 is a vertical cross-sectional view of an alternative embodiment of the bonded assembly according to the second embodiment of the present disclosure.

DETAILED DESCRIPTION

Figure 1:
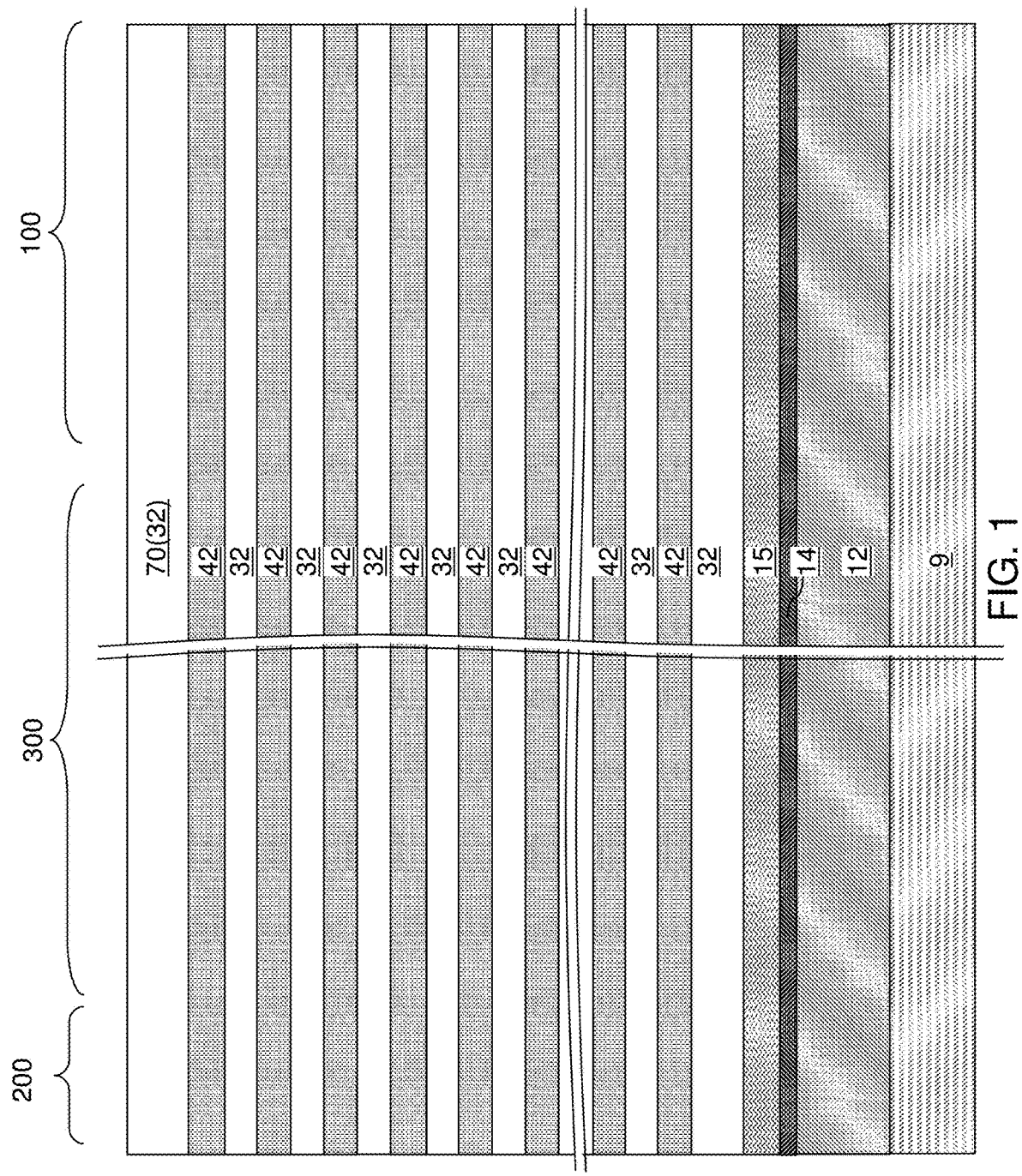
FIG. 1 is a schematic vertical cross-sectional view of a first exemplary structure after formation of a doped single crystalline semiconductor material layer, an optional etch stop layer, a disposable material layer, and an alternating stack of insulating layers and spacer material layers over a carrier substrate according to a first embodiment of the present disclosure.

As discussed above, the embodiments of the present disclosure are directed to a three-dimensional memory device containing hollow (e.g., "coreless") epitaxial pedestals and top source contact, and methods for making the same, the various aspects of which are described below. The embodiments of the present disclosure can be used to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, a first exemplary structure according to a first embodiment of the present disclosure is illustrated, which can be used, for example, to fabricate a three-dimensional NAND memory device. The first exemplary structure includes a layer stack (12, 14, 15, 32, 42, 70) over a carrier substrate 9. The layer stack (12, 14, 15, 32, 42, 70) can include, from bottom to top, a doped single crystalline semiconductor material layer 12, an optional etch stop layer 14, a disposable material layer 15, and an alternating stack of insulating layers 32 and spacer material layers, and an insulating cap layer 70 which can be a topmost insulating layer 32. In one embodiment, the carrier substrate 9 may comprise a single crystalline semiconductor or silicon on insulator substrate. In one embodiment, the carrier substrate 9 may comprise a commercially-available single crystalline silicon wafer.

The doped single crystalline semiconductor material layer 12 includes a doped single crystalline semiconductor material having a p-type doping or n-type doping. The doped single crystalline semiconductor material layer comprises doped single crystalline elemental semiconductor material, such as a doped single crystalline silicon layer, a doped compound single crystalline semiconductor material such as a silicon-germanium layer or a III-V compound semiconductor material, or any other doped single crystalline semiconductor material. The conductivity type of the doped single crystalline semiconductor material layer 12 may be the same as, or may be different from, the conductivity type of vertical semiconductor channels to be subsequently formed, which is herein referred to as a first conductivity type. Thus, the doped single crystalline semiconductor material layer 12 may have a doping of the first conductivity type (e.g., p-type) and may function as a horizontal semiconductor channel in a three-dimensional memory device, or may have a doping of a second conductivity type (e.g., n-type) that is the opposite of the first conductivity type and may function as a source layer that forms a p-n junction with the vertical semiconductor channels to be subsequently formed. The thickness of the doped single crystalline semiconductor material layer 12 may be in a range from 10 nm to 600 nm, such as from 30 nm to 200 nm, although lesser and greater thicknesses may also be employed.

The optional etch stop layer 14, if present, may be subsequently employed to as an etch stop during formation of backside trenches and/or during formation of a laterally-extending cavity. The optional etch stop layer 14, if present, may comprise silicon nitride, silicon oxide, silicon carbide nitride, or a dielectric metal oxide. The thickness of the etch stop layer 14 may be in a range from 1 nm to 30 nm, such as from 3 nm to 10 nm, although lesser and greater thicknesses may also be employed.

The disposable material layer 15 comprises a sacrificial material that may be subsequently removed selective to the materials of the insulating layers 32, the spacer material layers, and the etch stop layer 14 (or the doped single crystalline semiconductor material layer 12 in case the etch stop layer is not employed). The disposable material layer 15 may comprise amorphous silicon or titanium nitride. The thickness of the disposable material layer 15 may be in a range from 10 nm to 200 nm, such as from 20 nm to 100 nm, although lesser and greater thicknesses may also be employed.

The insulating layers 32 includes a first material which is an insulating material. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The spacer material layers include a second material that is different from the first material of the insulating layers 32. The spacer material layers may be formed as electrically conductive layers, or may be formed as sacrificial material layers 42 including a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride. The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include the same insulating material as the insulating layers 32, and may be a topmost insulating layer 32 and. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The exemplary structure can include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

Figure 2:
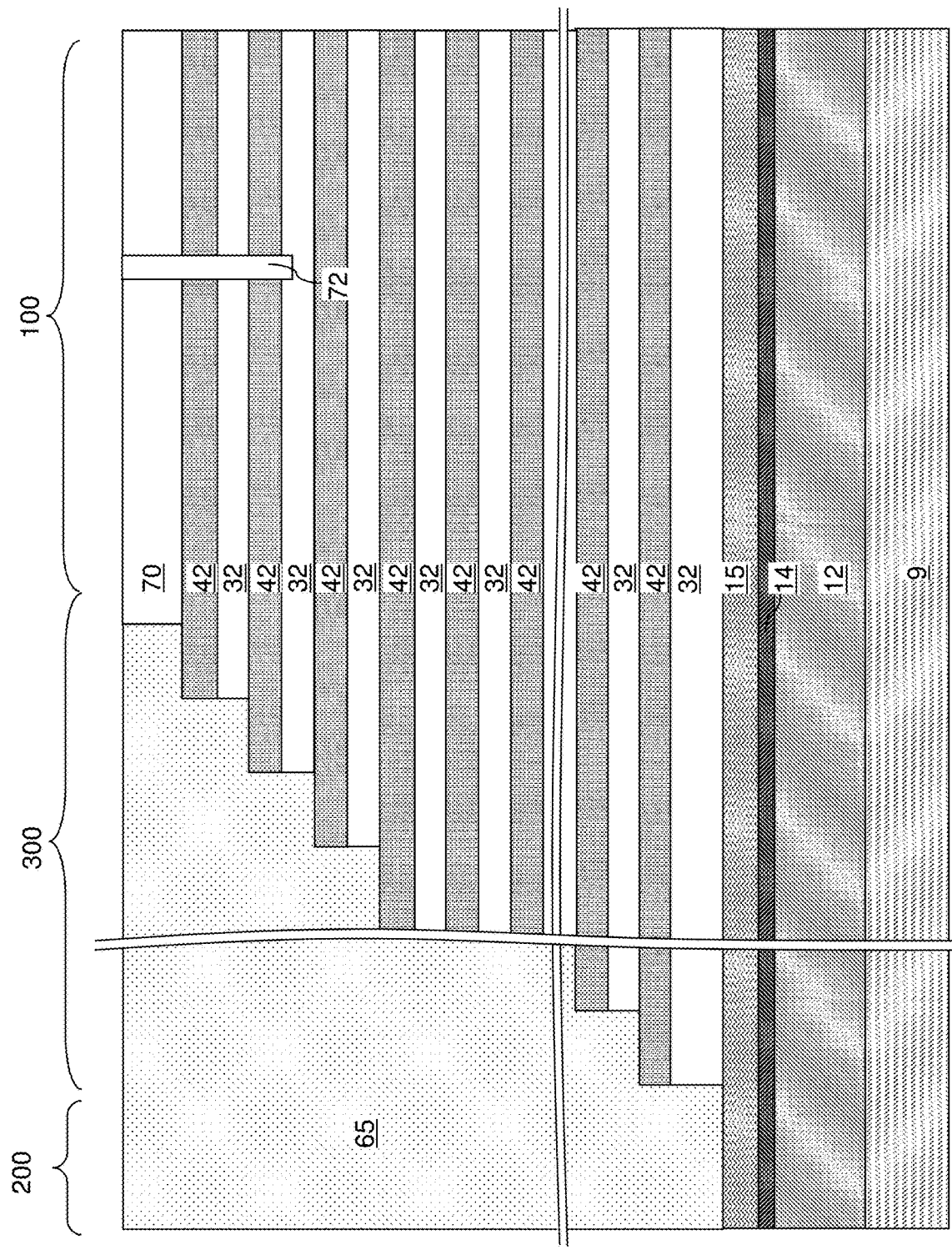
FIG. 2 is a schematic vertical cross-sectional view of the first exemplary structure after formation of stepped surfaces and a stepped dielectric material portion according to the first embodiment of the present disclosure.

Referring to FIG. 2, stepped surfaces are formed in the staircase region 300, which is also referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 3A:
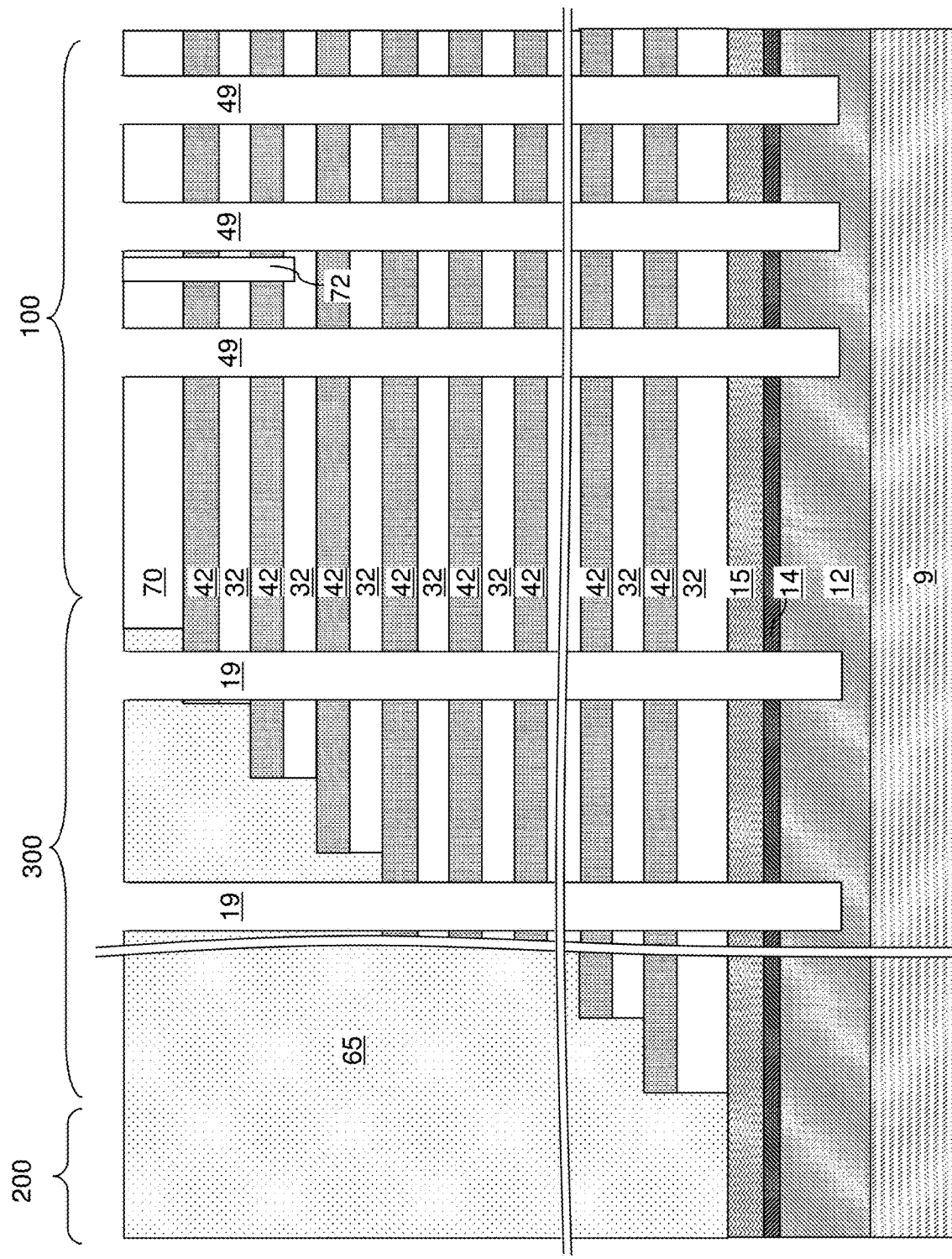
FIG. 3A is a schematic vertical cross-sectional view of the first exemplary structure after formation of memory openings and support openings according to the first embodiment of the present disclosure.
Figure 3B:
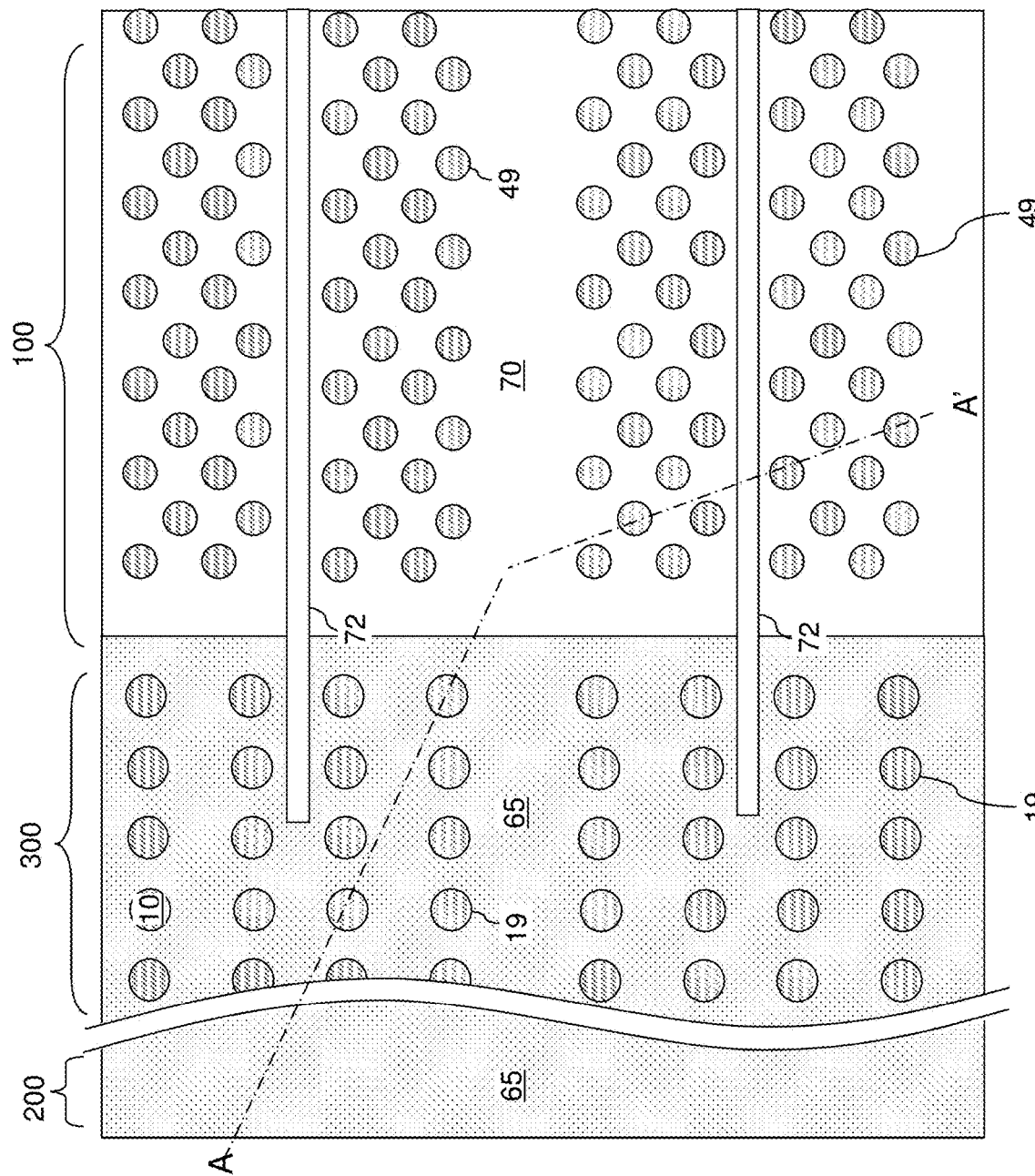
FIG. 3B is a top-down view of the first exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by performing an anisotropic etch process that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The anisotropic etch process can include a series of anisotropic etch steps that sequentially etch the materials of the stepped dielectric material portion 65 and the alternating stack (32, 42), the disposable material layer 15, the optional etch stop layer 14, and the doped single crystalline semiconductor material layer 12. The anisotropic etch process forms memory openings 49 in the memory array region 100, and forms a support openings 19 in the staircase region 300. Bottom surfaces of the memory openings 49 and the support openings 19 are formed in the single crystalline semiconductor material layer 12. Thus, the memory openings 49 and the support openings 19 can vertically extend through the alternating stack (32, 42) and the disposable material layer 15, and into an upper portion of the doped single crystalline semiconductor material layer 12. A two-dimensional array of memory openings 49 can be formed in the memory array region 100. A two-dimensional array of support openings 19 can be formed in the staircase region 300.

Figure 4:
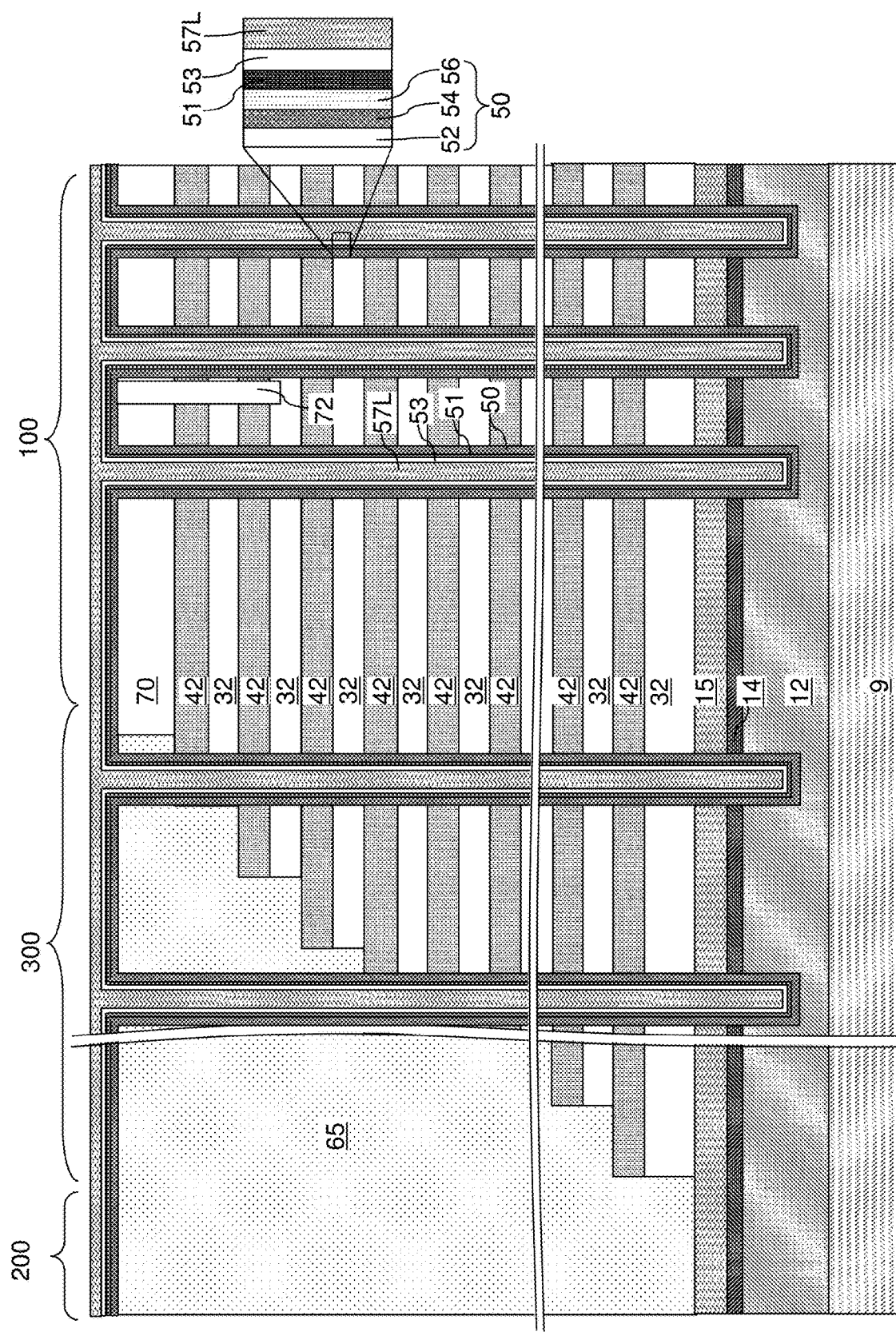
FIG. 4 is a schematic vertical cross-sectional view of the first exemplary structure after deposition of a memory film, an outer etch stop liner, an inner etch stop liner, and a sacrificial opening fill material layer in the memory openings and the support openings according to the first embodiment of the present disclosure.

Referring to FIG. 4, a memory film 50, an outer etch stop liner 51, an inner etch stop liner 53, and a sacrificial opening fill material layer 57L can be sequentially formed in the memory openings 49 and the support openings 19.

In one embodiment, the memory film 50 comprises a stack of layers including a blocking dielectric layer 52, a memory material layer 54, and a memory liner layer 56. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be used.

The memory material layer 54 includes a memory material, which may comprise a charge trapping material that can store electrical charges therein, a ferroelectric material that can have two different polarization directions, or a resistive memory material that can have at least two different resistive states. In one embodiment, the memory material layer 54 comprises a charge trapping material, such as silicon nitride. The memory material layer 54 may be formed as a continuous material layer, or may be formed as a vertical stack of discrete memory material portions.

The memory liner layer 56 includes a dielectric material that can provide electrical isolation to the memory material layer 54. In one embodiment, the memory liner layer 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The memory liner layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. The thickness of the tunneling dielectric layer 56 can be in a range from 2 nm to 20 nm, although lesser and greater thicknesses can also be used.

The outer etch stop liner 51 and the inner etch stop liner 53 include etch stop materials that are different from each other. The outer etch stop liner 51 includes a material that can function as an etch stop material during removal of the memory liner layer 56 and during removal of the inner etch stop liner 53. The inner etch stop liner 53 includes a material that can function as an etch stop material during removal of the material of the sacrificial opening fill material layer 57L. In one embodiment, the outer etch stop liner 51 includes a semiconductor material such as polysilicon or amorphous silicon, and the inner etch stop liner 53 includes a dielectric material, such as silicon oxide, silicon nitride, or a dielectric metal oxide. The thickness of each of the outer etch stop liner 51 and the inner etch stop liner 53 may be in a range from 1 nm to 20 nm, such as from 3 nm to 8 nm, although lesser and greater thicknesses may also be employed.

The sacrificial opening fill material layer 57L comprises a material that may be subsequently removed selective to the material of the inner etch stop liner 53. For example, the sacrificial opening fill material layer 57L may comprise a semiconductor material (such as amorphous silicon or polysilicon), or a non-semiconductor material, such as borosilicate glass, organosilicate glass, or amorphous carbon.

Figure 5:
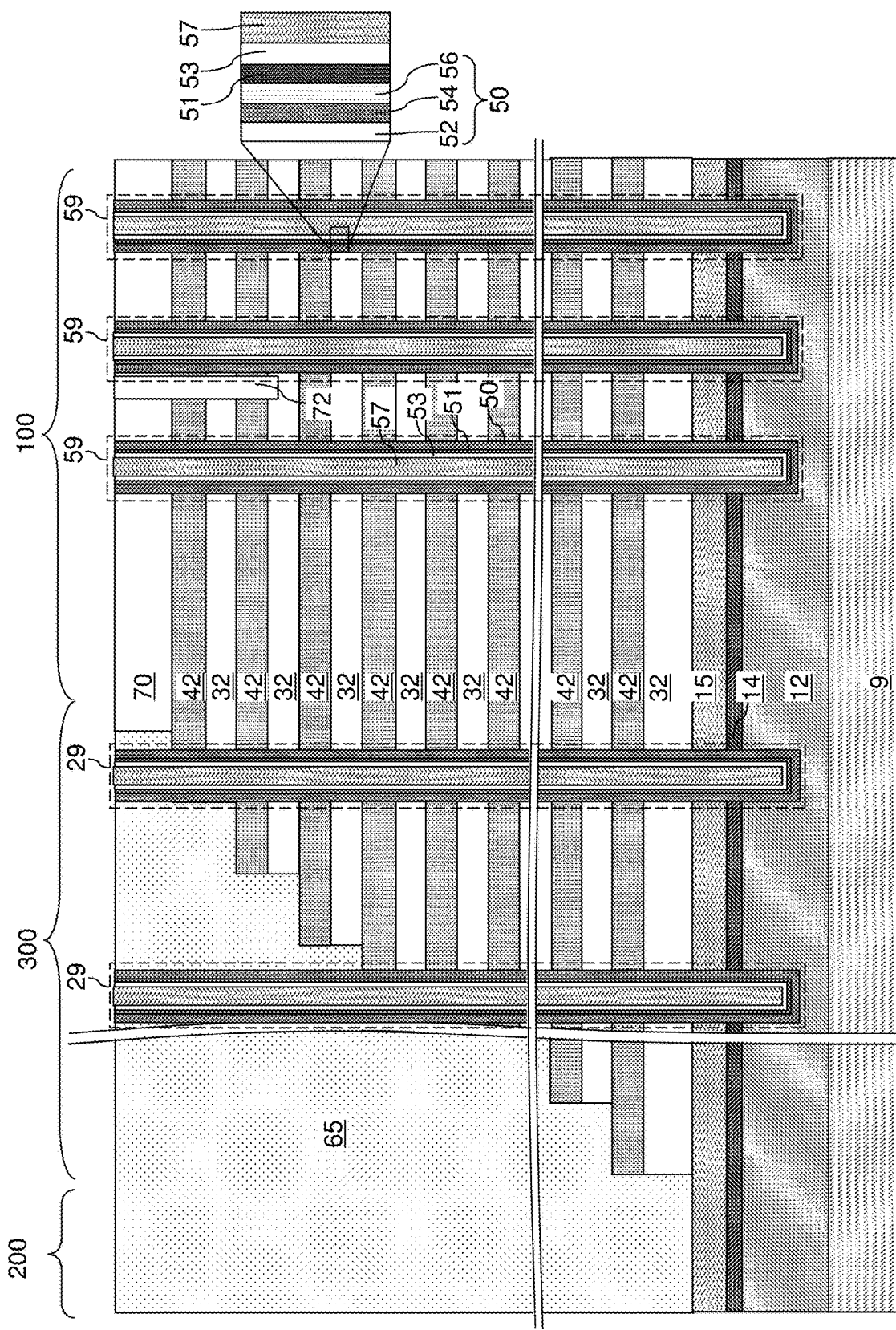
FIG. 5 is a schematic vertical cross-sectional view of the first exemplary structure after formation sacrificial memory opening fill structures and sacrificial support opening fill structures according to the first embodiment of the present disclosure.

Referring to FIG. 5, portions of the sacrificial opening fill material layer 57L, the inner etch stop liner 53, the outer etch stop liner 51, and the memory film 50 that overlie a horizontal plane including a top surface of the insulating cap layer 70 can be removed by a planarization process. The planarization process may employ a chemical mechanical planarization process or a recess etch process. The set of all remaining portions of the sacrificial opening fill material layer 57L, the inner etch stop liner 53, the outer etch stop liner 51, and the memory film 50 in each memory opening 49 constitutes a sacrificial memory opening fill structure 59. The set of all remaining portions of the sacrificial opening fill material layer 57L, the inner etch stop liner 53, the outer etch stop liner 51, and the memory film 50 in each support opening 19 constitutes a sacrificial support opening fill structure 29. Each of the sacrificial memory opening fill structures 59 and a sacrificial support opening fill structures 29 comprises a respective memory film 50, a respective outer etch stop liner 51, a respective the inner etch stop liner 53, and the respective sacrificial opening fill material portion 57 that is a remaining portion of the sacrificial opening fill material layer 57L.

Figure 6:
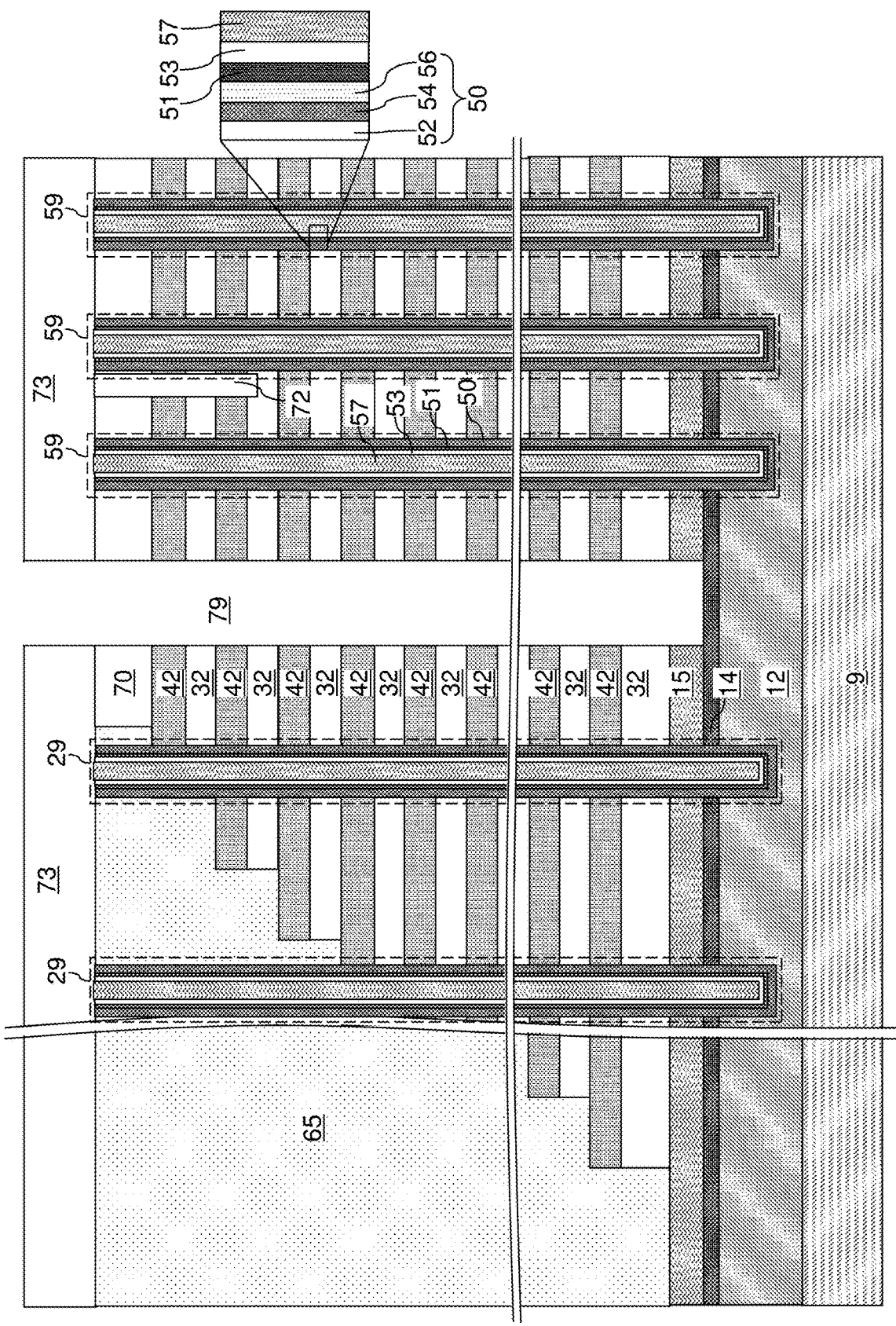
FIG. 6 is a schematic vertical cross-sectional view of the first exemplary structure after formation of a sacrificial capping layer and backside trenches according to the first embodiment of the present disclosure.

Referring to FIG. 6, a sacrificial capping layer 73 can be deposited over the insulating cap layer 70 and the stepped dielectric material portion 65. The sacrificial capping layer 73 includes a material that is a different from the materials of the disposable material layer 15 and a sacrificial material layers 42. For example, the sacrificial capping layer 73 may comprise undoped silicate glass (i.e., silicon oxide) or a doped silicate glass. The thickness of the sacrificial capping layer 73 may be in a range from 30 nm to 100 nm, although lesser and greater thicknesses may also be employed.

A photoresist layer (not shown) can be applied over the sacrificial capping layer 73, and is lithographically patterned to form openings in areas between clusters of sacrificial memory opening fill structures 59. The pattern in the photoresist layer can be transferred through the sacrificial capping layer 73, the alternating stack (32, 42) and the stepped dielectric material portion 65, and the disposable material layer 15 by performing an anisotropic etch process. The etch stop layer 14 may be employed as an etch stop structure during the anisotropic etch process. The anisotropic etch process forms backside trenches 79, which vertically extend from the top surface of the sacrificial capping layer 73 at least into the disposable material layer 15, and laterally extend through the memory array region 100 and the staircase region 300.

In one embodiment, the backside trenches 79 can laterally extend along a first horizontal direction (e.g., word line direction) hd1 and can be laterally spaced apart one from another along a second horizontal direction (e.g., bit line direction) hd2 that is perpendicular to the first horizontal direction hd1. The sacrificial memory opening fill structures 59 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of sacrificial memory opening fill structures 59 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 7:
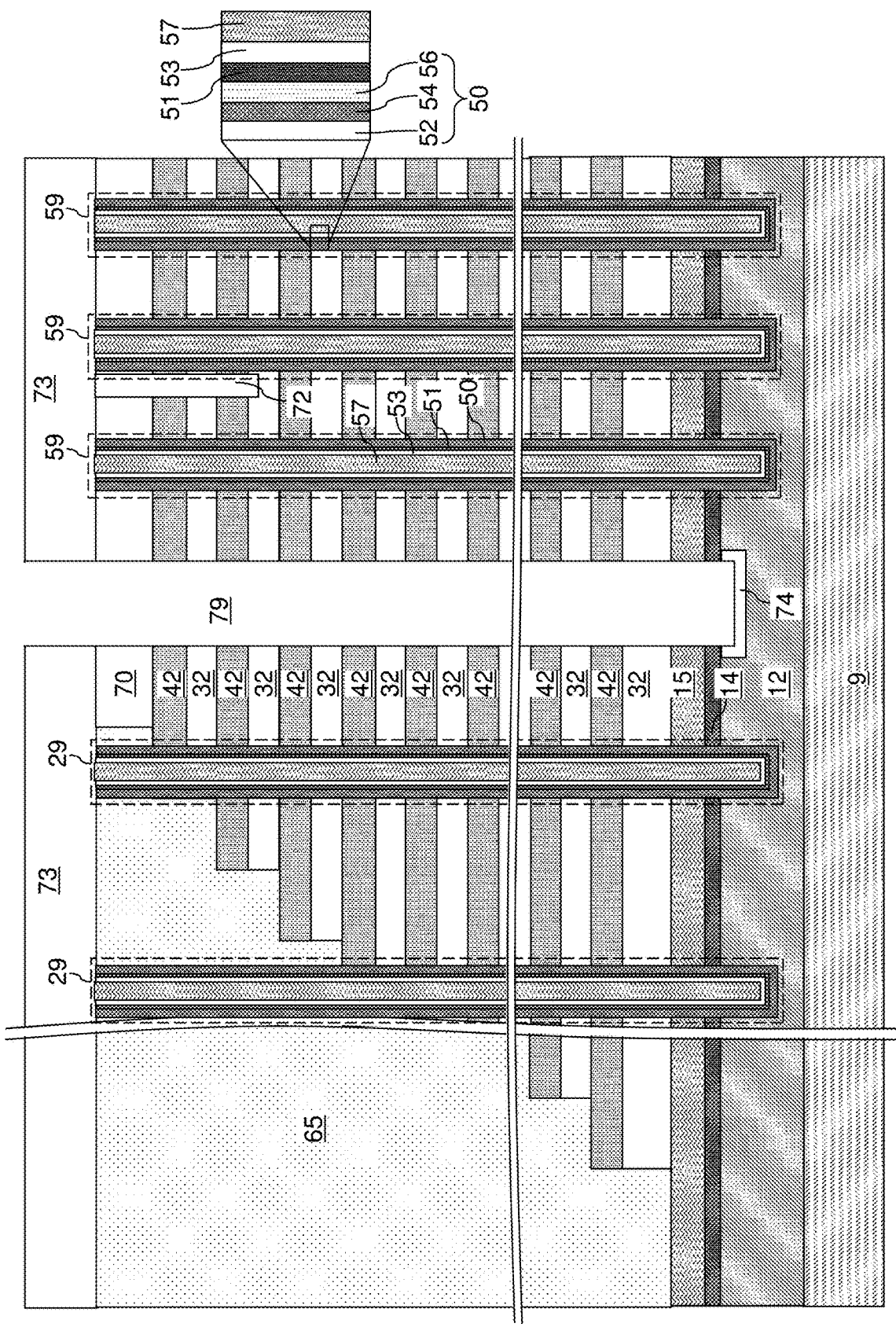
FIG. 7 is a schematic vertical cross-sectional view of an alternative configuration of the first exemplary structure after formation of backside trenches according to the first embodiment of the present disclosure.

Referring to FIG. 7, an alternative configuration of the first exemplary structure can be derived from the first exemplary structure illustrated in FIG. 6 in case the anisotropic etch process etches through the etch stop layer 14 so that the backside trenches 79 vertically extend into on upper portion of the doped single crystalline semiconductor material layer 12. In this case, an oxidation process may be performed to convert physically exposed surface portions of the doped single crystalline semiconductor material layer 12 into a dielectric semiconductor oxide portion 74 (such as a silicon oxide portion) at the bottom of each backside trench 79. In this case, the disposable material layer 15 may comprise titanium nitride or another material that is not affected by the oxidation process.

Figure 8:
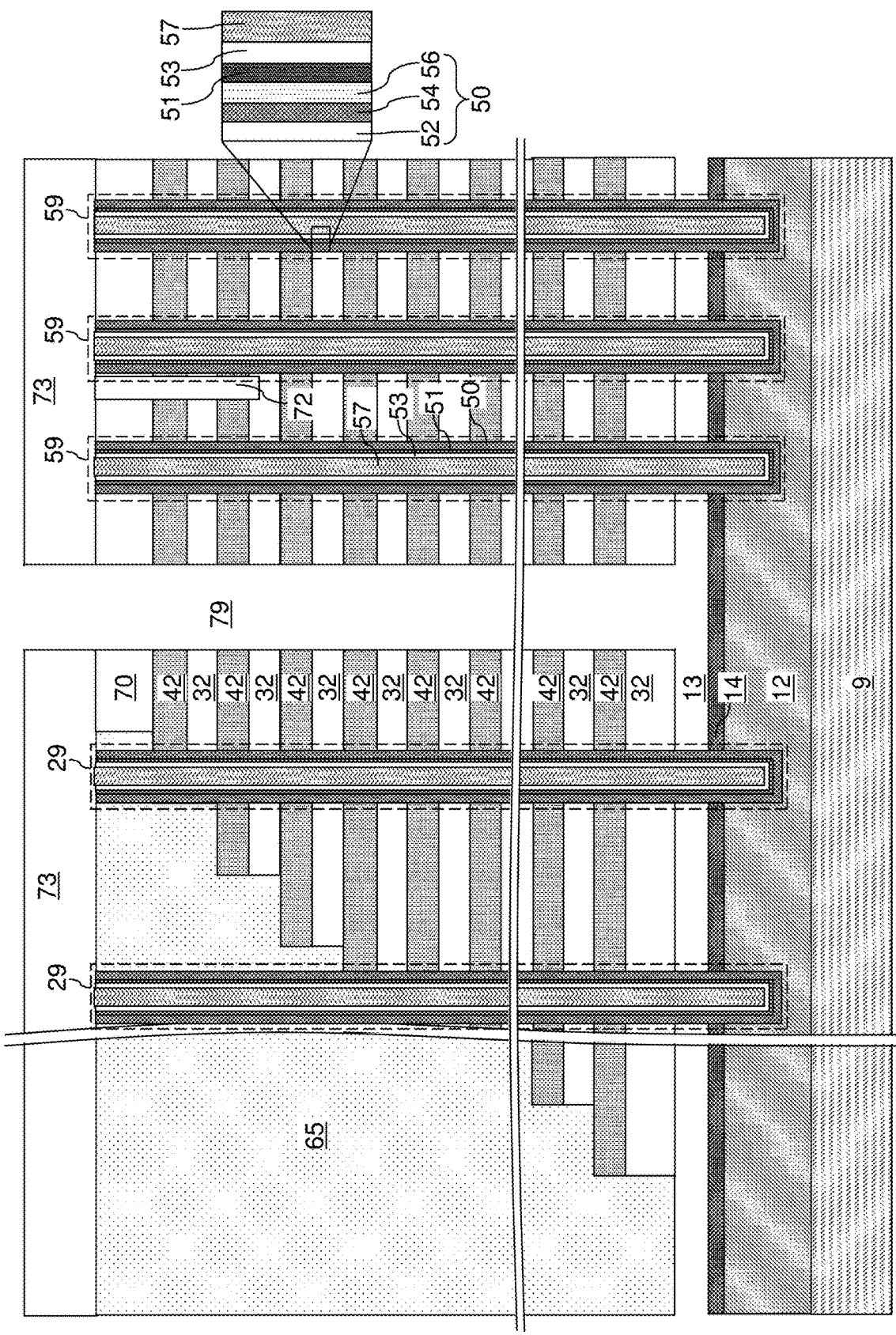
FIG. 8 is a schematic vertical cross-sectional view of the first exemplary structure after formation of a laterally-extending cavity according to the first embodiment of the present disclosure.

Referring to FIG. 8, an isotropic etch process can be performed in to remove the disposable material layer 15 selective to the materials of the alternating stack (32, 42), the sacrificial capping layer 73, and the etch stop layer 14 (or the doped single crystalline semiconductor material layer 12 in case the etch stop layer is not employed). For example, if the disposable material layer 15 comprises amorphous silicon, a selective using hot trimethyl-2 hydroxyethyl ammonium hydroxide ("hot TMY") etch may be performed. Generally, a first isotropic etchant that etches the material of the disposable material layer 15 selective to the materials of the alternating stack (32, 42) can be introduced into the backside trenches 79, and the disposable material layer 15 can be removed selective to the materials of the alternating stack (32, 42) and without removing the doped single crystalline semiconductor material layer 12. A laterally-extending cavity 13 is formed in a continuous a volume from which the disposable material layer 15 is removed.

Figure 9:
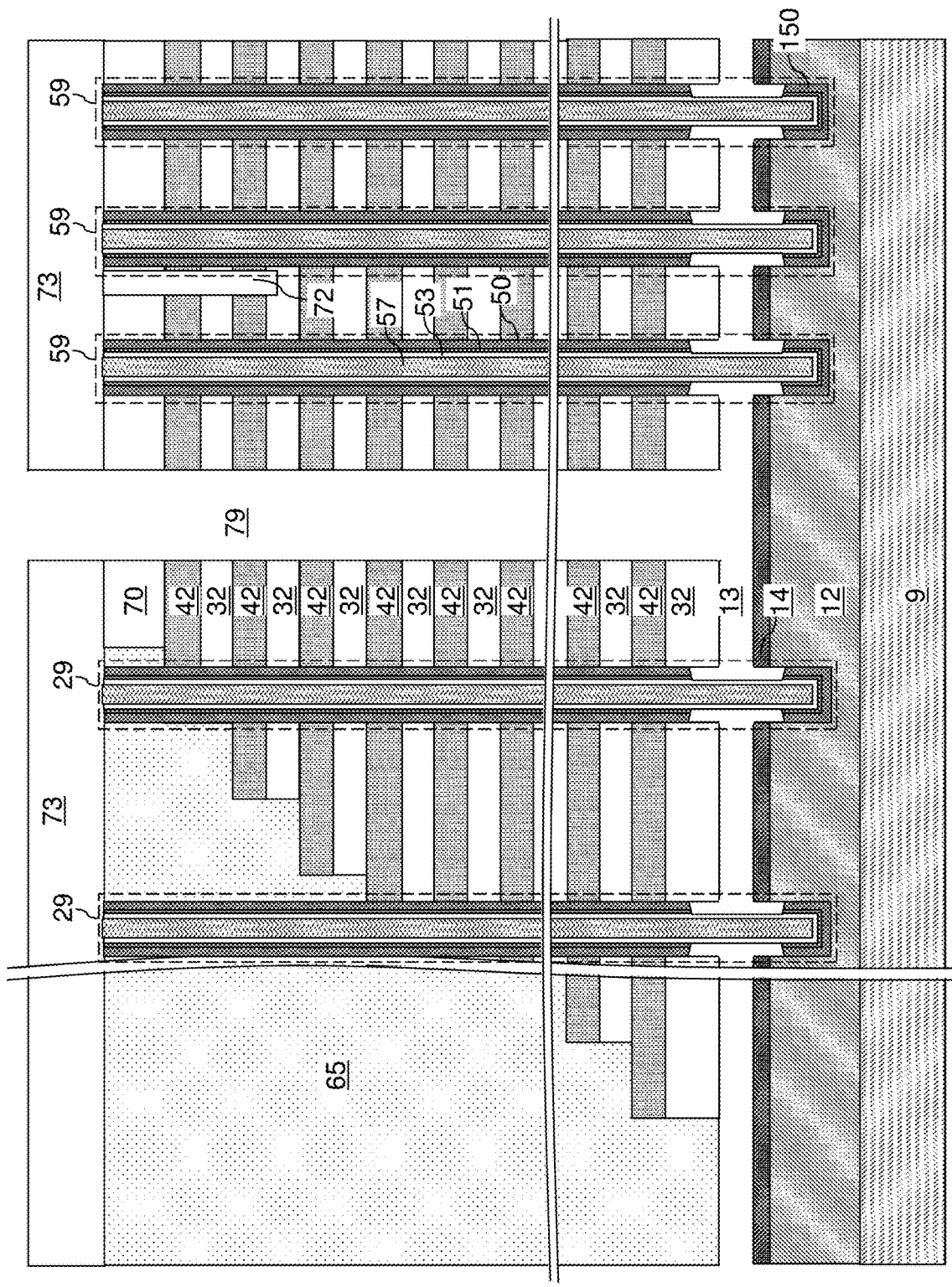
FIG. 9 is a schematic vertical cross-sectional view of the first exemplary structure after removal of proximal portions of the memory films around the laterally-extending cavity according to the first embodiment of the present disclosure.

Referring to FIG. 9, proximal portions of the memory films 50 (i.e., portions of the memory films 50 that are proximal to the laterally-extending cavity 13) can be removed from around the laterally-extending cavity 13 by performing a sequence of isotropic etch processes. The sequence of isotropic etch processes may comprise a first isotropic etch step that etches the material of the blocking dielectric layers 52, a second isotropic etch step that etches the material of the memory material layers 54, and the third isotropic etch step that etches the material of the memory liner layers 56. The duration of each of the first, second, and third isotropic etch steps may be selected such that a cylindrical sidewall segment of the doped single crystalline semiconductor material layer 12 is physically exposed to a tubular recess cavity that is formed by removal of a cylindrical portion of a respective one of the memory films 50. Each memory film 50 is divided into a cylindrical portion that is easily embedded in the alternating stack (32, 42) and is hereafter referred to as a memory film 50, and an end cap portion that is embedded in the doped single crystalline semiconductor material layer 12 and is hereafter referred to as a dielectric capping structure 150. Each dielectric capping structure 150 comprises a layer stack of a first material layer having a same thickness and a same material composition as the blocking dielectric layers 52, a second material layer having a same thickness and a same material composition as the memory material layers 54, and a third material layer having a same thickness and a same material composition as the memory liner layers 56.

Further, an additional isotropic etch process (e.g., a hot TMY process) may be performed to remove physically exposed portions of the outer etch stop liner 51. A cylindrical surface segment of each inner etch stop liner 53 can be physically exposed to the laterally-extending cavity 13. A cylindrical surface segment of the doped single crystalline semiconductor material layer 12 can be physically exposed around a bottom portion of each of the sacrificial memory opening fill structures 59 and the sacrificial support opening fill structures 29.

Figure 10:
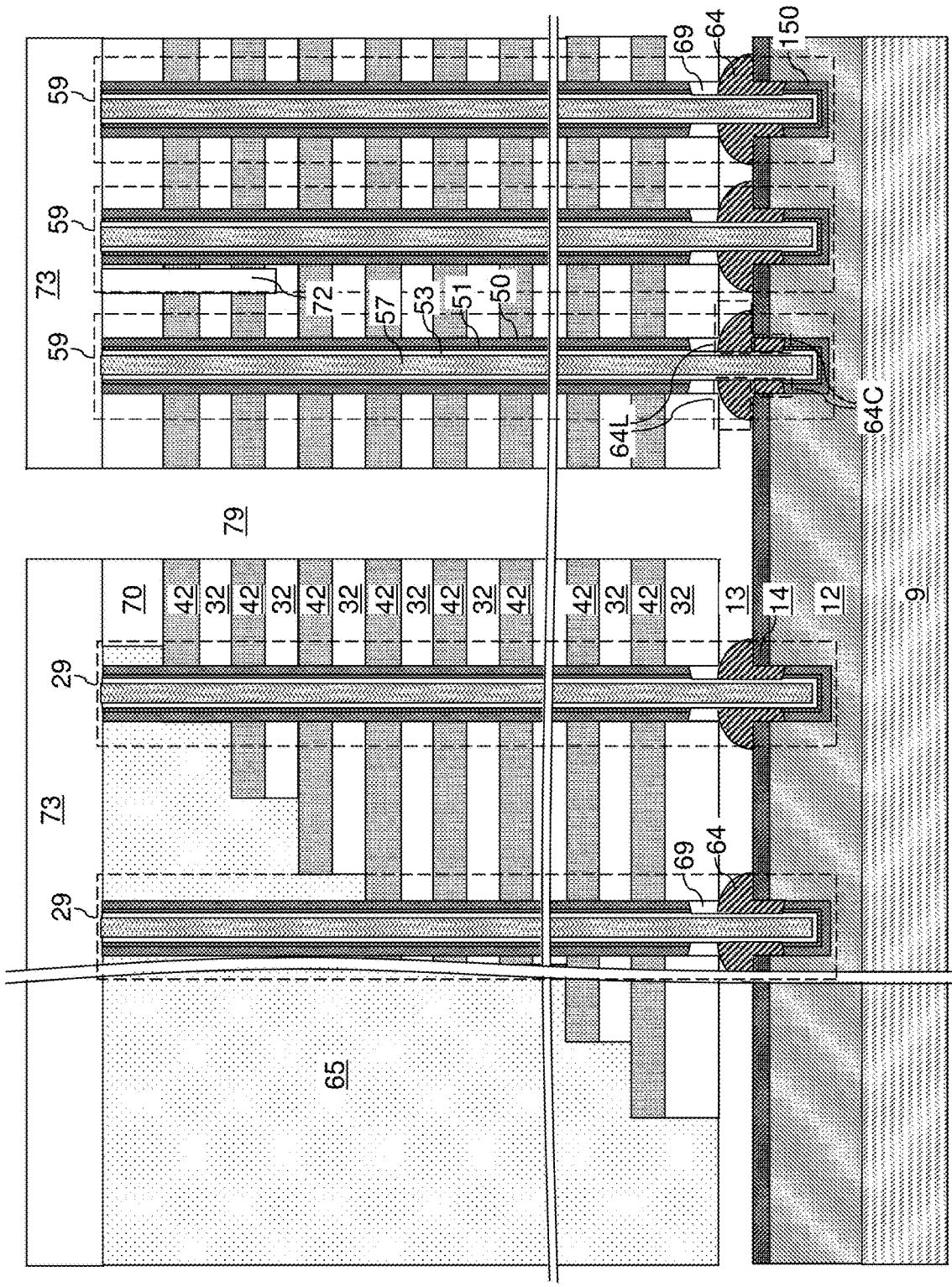
FIG. 10 is a schematic vertical cross-sectional view of the first exemplary structure after formation of coreless epitaxial semiconductor pedestals according to the first embodiment of the present disclosure.

Referring to FIG. 10, a first selective epitaxy process can be performed, which grows an epitaxial semiconductor material, such as single crystalline silicon, from the cylindrical surface segments of the doped single crystalline semiconductor material layer 12. The first exemplary structure can be placed in a vacuum process chamber configured to perform the first selective epitaxy process. During the first selective epitaxy process, a reactant gas (which is a semiconductor precursor gas) and an etchant gas can be concurrently or alternately flowed into the process chamber. The reactant gas and the etchant gas can be selected based on the material composition of the epitaxial semiconductor material to be deposited. For example, the reactant gas may be selected from silane, disilane, dichlorosilane, and a trichlorosilane, and etchant gas may comprise gas phase hydrogen chloride. Generally, a semiconductor material can grow from semiconductor surfaces without any nucleation delay, but has a finite nucleation delay (which is also referred to as a nucleation time) for growth from dielectric surfaces. The deposition temperature and the flow rates of the reactant gas and the etchant gas can be selected such that the net growth rate (i.e., the deposition rate less the etch rate) of the deposited semiconductor material is positive on semiconductor surfaces (such as the cylindrical surface segments of the doped single crystalline semiconductor material layer 12), and is substantially zero on dielectric surfaces (such as the physically exposed surfaces of the alternating stack (32, 42), the sacrificial capping layer 73, and the etch stop layer 14.

The deposited semiconductor material nucleates on the cylindrical surfaces segments of the doped single crystalline semiconductor material layer 12, grows upward in each cylindrical volume laterally surrounded by the doped a single crystalline semiconductor material layer 12 and the etch stop layer 14, and then grows isotropically or with the faceting in all generally-upward directions corresponding to the radial directions in a hemisphere until a growth surface of each deposited semiconductor material portion contacts a bottom surface of the bottommost insulating layer 32 within the alternating stack (32, 42). Each deposited semiconductor material portion laterally surrounds a cylindrical region laterally bounded by an outer sidewall of a respective inner etch stop liner 53. In other words, each deposited semiconductor material portion (e.g., single crystalline silicon portion) is hollow and lacks a core of the same material (e.g., single crystalline silicon) in a volume that is laterally bounded by the outer sidewall of the respective inner etch stop liner 53. Further, each deposited semiconductor material portion maybe a single crystalline semiconductor material portion in epitaxial alignment with the single crystalline material of the doped single crystalline semiconductor material layer 12. For this reason, each ring-shaped deposited semiconductor material portion is herein referred to as a "coreless epitaxial semiconductor pedestal" 64, i.e., a hollow ring-shaped structure having a general shape of a pedestal and including an epitaxial semiconductor material (e.g., single crystalline silicon) which lacks a core of the same material (e.g., single crystalline silicon).

Each coreless epitaxial semiconductor pedestal 64 comprises a cylindrical epitaxial semiconductor portion 64C and an annular laterally-protruding portion 64L having a greater lateral extent than the cylindrical epitaxial semiconductor portion 64L. In one embodiment, each of the coreless epitaxial semiconductor pedestals 64 may have a general shape of a coreless mushroom, i.e., the shape that is derived from the shape of a mushroom having a single umbrella-like head portion and a narrower stem portion which protrudes below the head portion. In one embodiment, each of the coreless epitaxial semiconductor pedestals 64 may comprise a cylindrical inner sidewall that extends through the cylindrical epitaxial semiconductor portion 64C and through the annular laterally-protruding portion 64L and contacts a portion (150, 53) of the sacrificial memory opening fill structure 59.

In one embodiment, each of the coreless epitaxial semiconductor pedestals 64 may comprise a cylindrical outer sidewall that contacts the doped single crystalline semiconductor material layer 12. In one embodiment, the annular laterally-protruding portion 64L of each coreless epitaxial semiconductor pedestal 64 comprises an annular horizontal surface having an inner periphery that is adjoined to a closed edge of the cylindrical outer sidewall. The annular horizontal surface of the annular laterally-extending portion 64L may contact the top surface of the etch stop layer 14.

In one embodiment, the annular laterally-protruding portion 64L of each coreless epitaxial semiconductor pedestal 64 comprises a convex or faceted surface that is adjoined to an outer periphery of the annular horizontal surface of the annular laterally-protruding portion 64L. In one embodiment, the convex or faceted surface of the annular laterally-protruding portion 64L can be physically exposed to the remaining volume of the laterally-extending cavity 13. In one embodiment, the growth of the deposited semiconductor material during formation of the annular laterally-protruding portions 64L may be isotropic, and the physically exposed surfaces of the annular laterally-protruding portions 64L may be convex throughout. In one embodiment, the growth of the deposited semiconductor material during formation of the annular laterally-protruding portions 64L may form crystallographic facets, and the physically exposed surfaces of the annular laterally-protruding portions 64L may be faceted. A cylindrical cavity 69 may be formed above each epitaxial semiconductor pedestal 64 around a respective one of the sacrificial memory opening fill structures 59 (i.e., around inner etch stop liner 53) and the sacrificial support opening fill structures 29.

Figure 11:
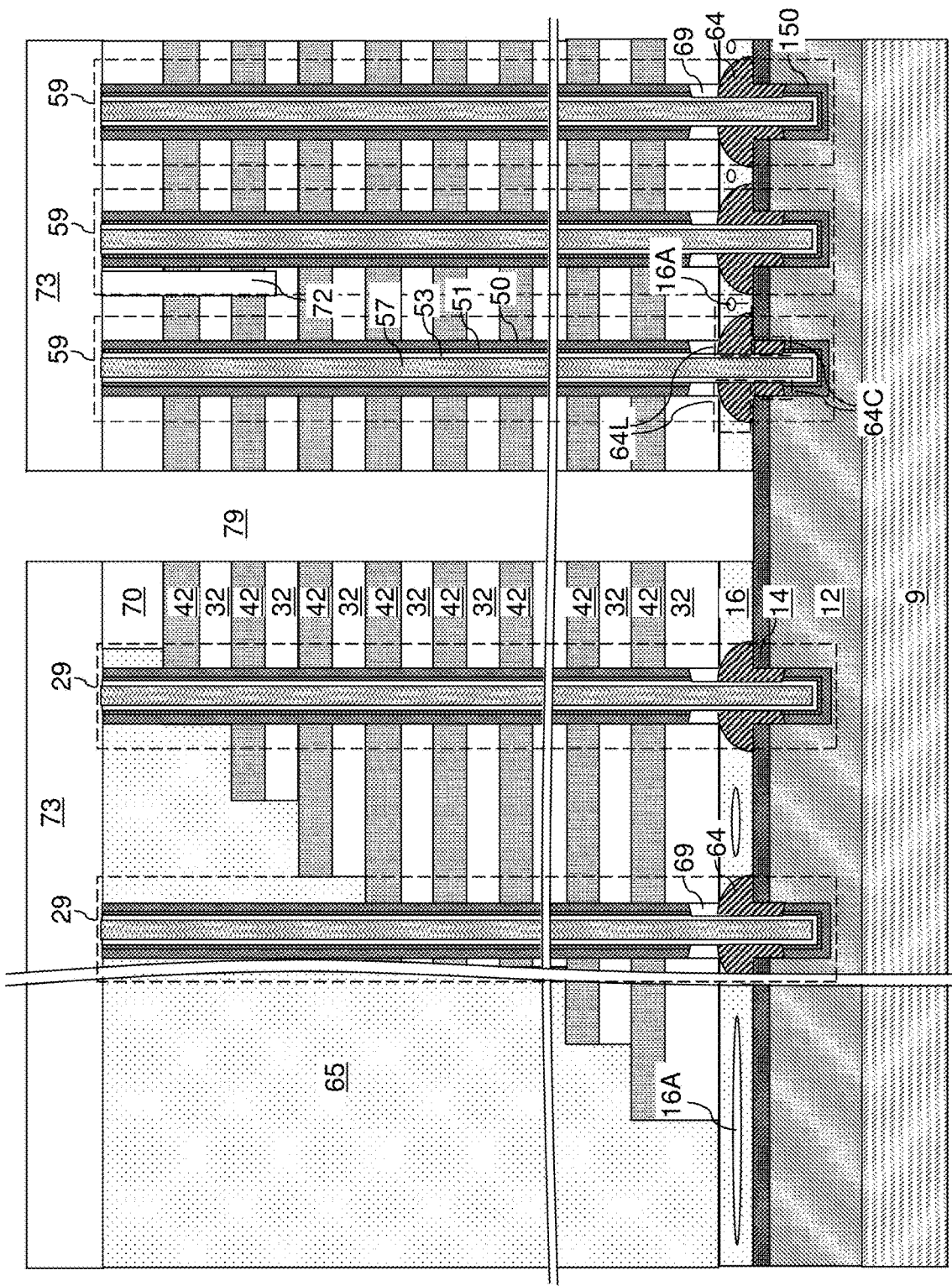
FIG. 11 is a schematic vertical cross-sectional view of the first exemplary structure after formation of a dielectric isolation layer according to the first embodiment of the present disclosure.

Referring to FIG. 11, a dielectric fill material may be deposited in remaining volumes of the laterally-extending cavity 13. Portions of the dielectric fill material that is collaterally deposited in peripheral regions of the backside trenches 79 and over the sacrificial capping layer 73 can be removed, for example, by performing an anisotropic etch process. The remaining portion of the dielectric fill material that fills the laterally-extending cavity 13 constitutes a dielectric isolation layer 16. The dielectric isolation layer 16 can be deposited directly on the epitaxial semiconductor material of the coreless epitaxial semiconductor pedestals 64.

In one embodiment, a periphery of each interface between the annular laterally-protruding portions 64L and the dielectric isolation layer 16 may be in contact with an insulating layer 32 (such as the bottommost insulating layer 32) within the alternating stack (32, 42). The dielectric isolation layer 16 may be free of any void therein, or may embed at least one airgap 16A. In one embodiment, the convex or faceted surface of the annular laterally-protruding portion 64L contacts the dielectric isolation layer 16.

Figure 12:
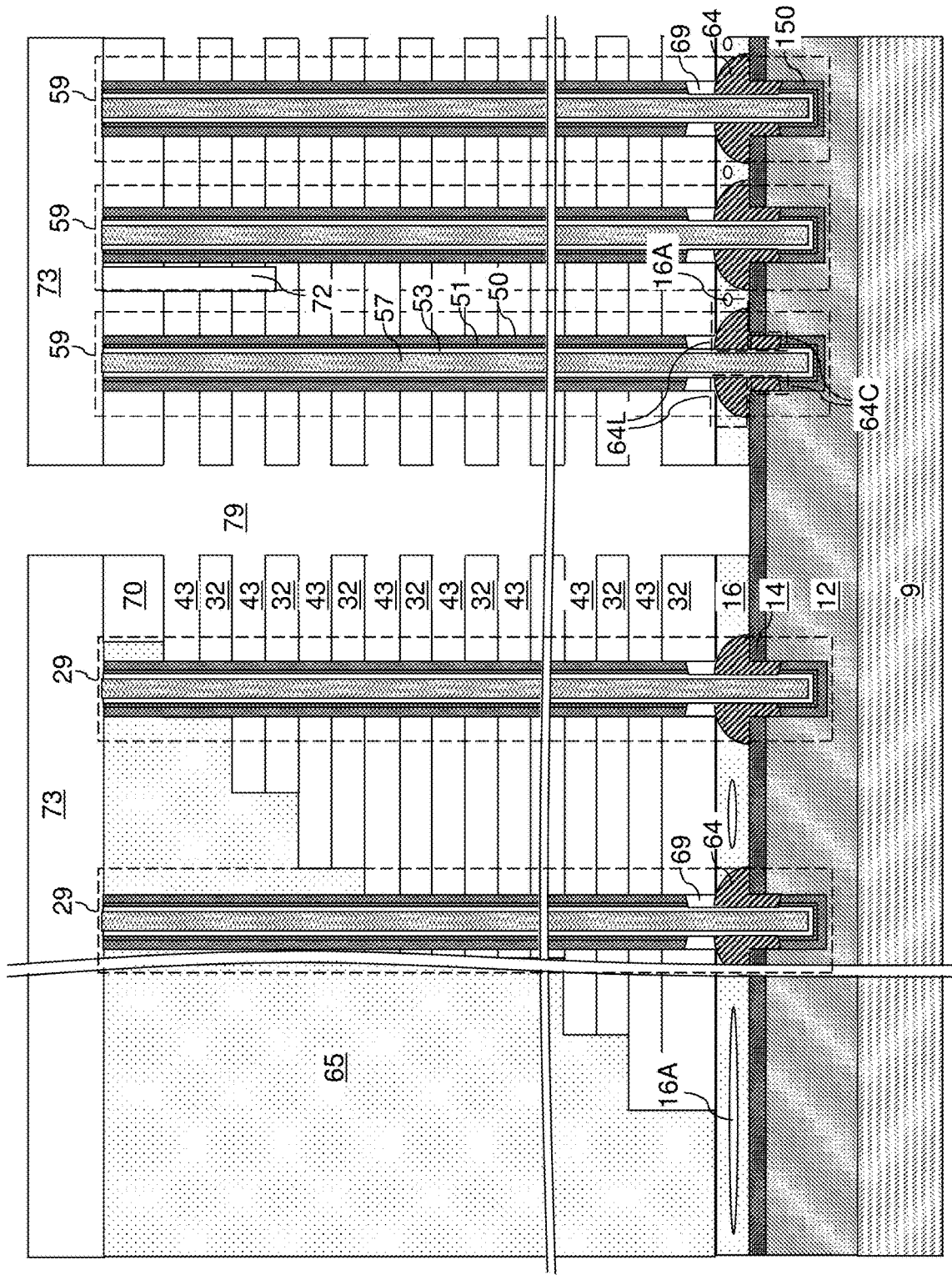
FIG. 12 is a schematic vertical cross-sectional view of the first exemplary structure after formation of backside recesses according to the first embodiment of the present disclosure.

Referring to FIG. 12, in case the spacer material layers of the alternating stack are formed as sacrificial material layers 42, the sacrificial materials 42 can be subsequently replaced with electrically conductive layers. In this case, a second isotropic etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the material of the dielectric isolation layer 16, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The dielectric isolation layer 16, the sacrificial memory opening fill structures 59, the sacrificial support opening fill structures 29, the insulating layers 32, and the stepped dielectric material portion 65 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. Each of the plurality of backside recesses 43 can extend substantially parallel to the top surface of the carrier substrates 9. A backside recess 43 can be vertically bounded by a top surface of an underlying insulating layer 32 and a bottom surface of an overlying insulating layer 32. In one embodiment, each backside recess 43 can have a uniform height throughout.

Figure 13:
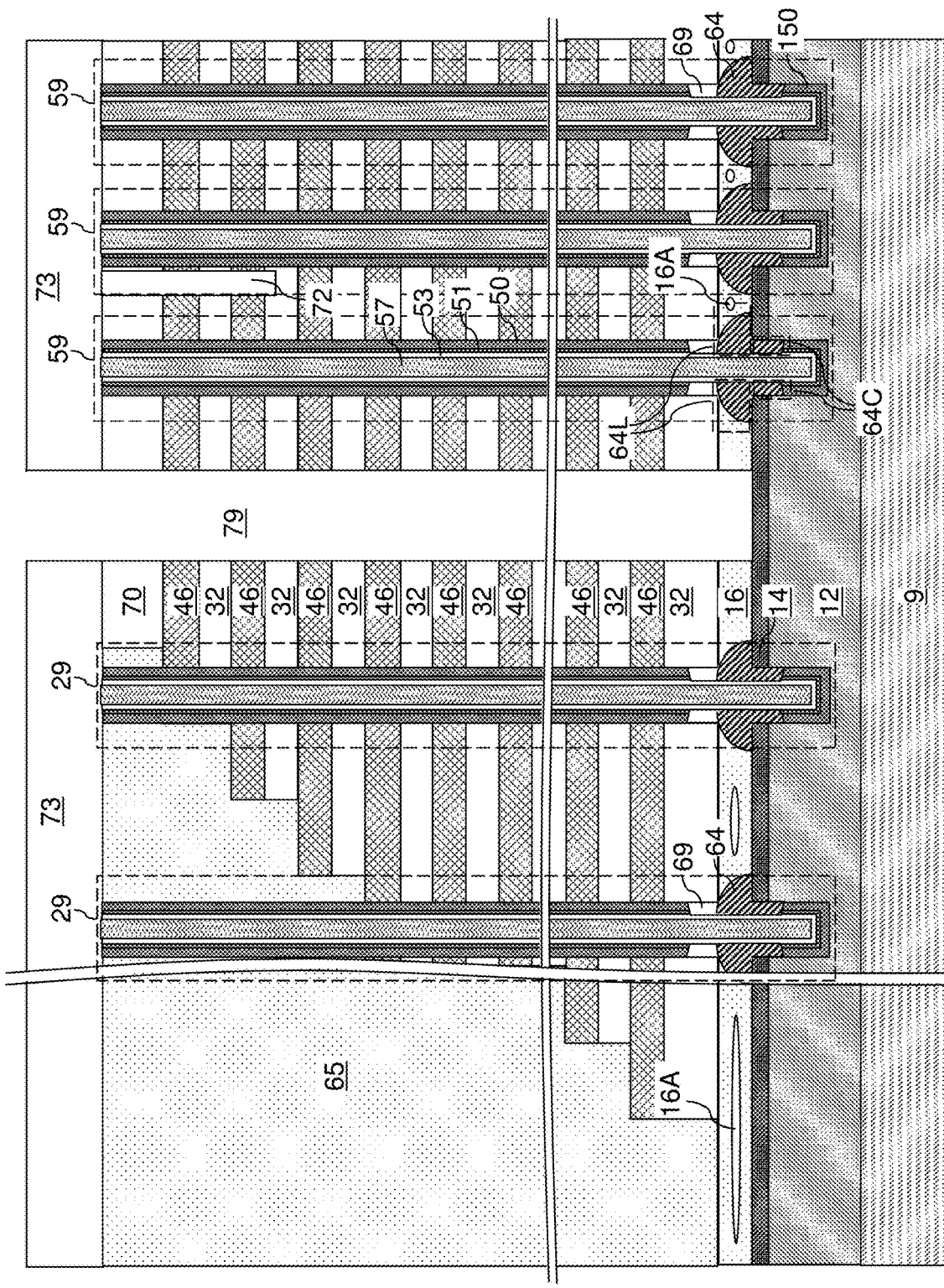
FIG. 13 is a schematic vertical cross-sectional view of the first exemplary structure after formation of electrically conductive layers according to the first embodiment of the present disclosure.

Referring to FIG. 13, a backside blocking dielectric layer (not shown) can be optionally formed by a conformal deposition process on physically exposed surfaces around the backside recesses 43 and at peripheral regions of the backside trenches 79. The backside blocking dielectric layer comprises a dielectric material such as a dielectric metal oxide. The thickness of the backside blocking dielectric layer (not shown) can be in a range from 1 nm to 15 nm, such as 2 to 6 nm, although lesser and greater thicknesses can also be used.

At least one reactant that deposits at least one conductive material can be introduced into the backside recesses 43 through the backside trench 79 in a conformal deposition process. For example, at least one metallic material can be deposited in the plurality of backside recesses 43, on the sidewalls of the at least one the backside trench 79, and over the top surface of the sacrificial capping layer 73. The at least one metallic material can include a conductive metal nitride material (such as TiN, TaN, or WN) and a metallic fill material (such as W, Co, Ru, Ti, and/or Ta). Each metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous metallic material layer (not shown) can be formed on the sidewalls of each backside trench 79 and over the sacrificial capping layer 73. Each electrically conductive layer 46 includes a portion of the metallic barrier liner and a portion of the metallic fill material layer that are located between a vertically neighboring pair of dielectric material layers such as a pair of insulating layers 32. The continuous metallic material layer (not shown) includes a continuous portion of the metallic barrier liner and a continuous portion of the metallic fill material layer that are located in the backside trenches 79 or above the sacrificial capping layer 73. Each sacrificial material layer 42 can be replaced with an electrically conductive layer 46. A backside cavity is present in the portion of each backside trench 79 that is not filled with the optional backside blocking dielectric layer and the continuous metallic material layer.

The deposited metallic material of the continuous electrically conductive material layer is etched back from the sidewalls of each backside trench 79 and from above the sacrificial capping layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the sacrificial memory opening fill structures 59. In other words, each electrically conductive layer 46 can be a word line that functions as a common control gate electrode for the plurality of vertical memory devices. The word lines comprise a metallic (e.g., metal or metal alloy) material. One or more top most electrically conductive layers 46 may comprise drain side select gate electrodes of the NAND strings. The electrically conductive layers 46 may comprise the bottommost source side select gate electrode of the NAND strings. Optionally, one or more bottommost electrically conductive layers 46 may comprise additional source side select gate electrodes of the NAND strings.

Figure 14A:
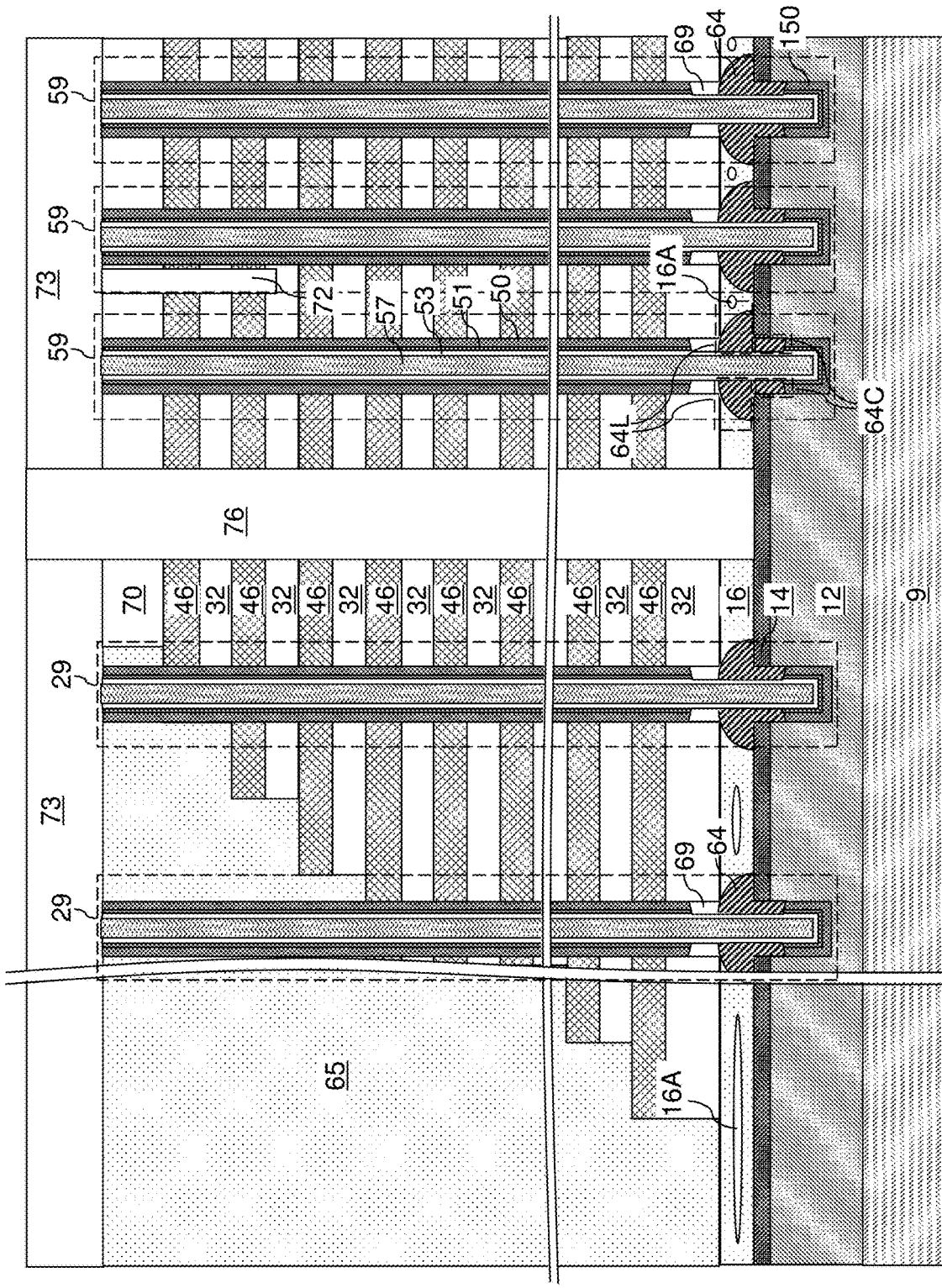
FIG. 14A is a schematic vertical cross-sectional view of the first exemplary structure after formation of backside trench fill structures according to the first embodiment of the present disclosure.

Referring to FIGS. 14A and 14B, an insulating material such as silicon oxide can be conformally deposited in the backside trenches 79 to form a backside trench via structure 76 within each of the backside trenches 79.

Figure 15:
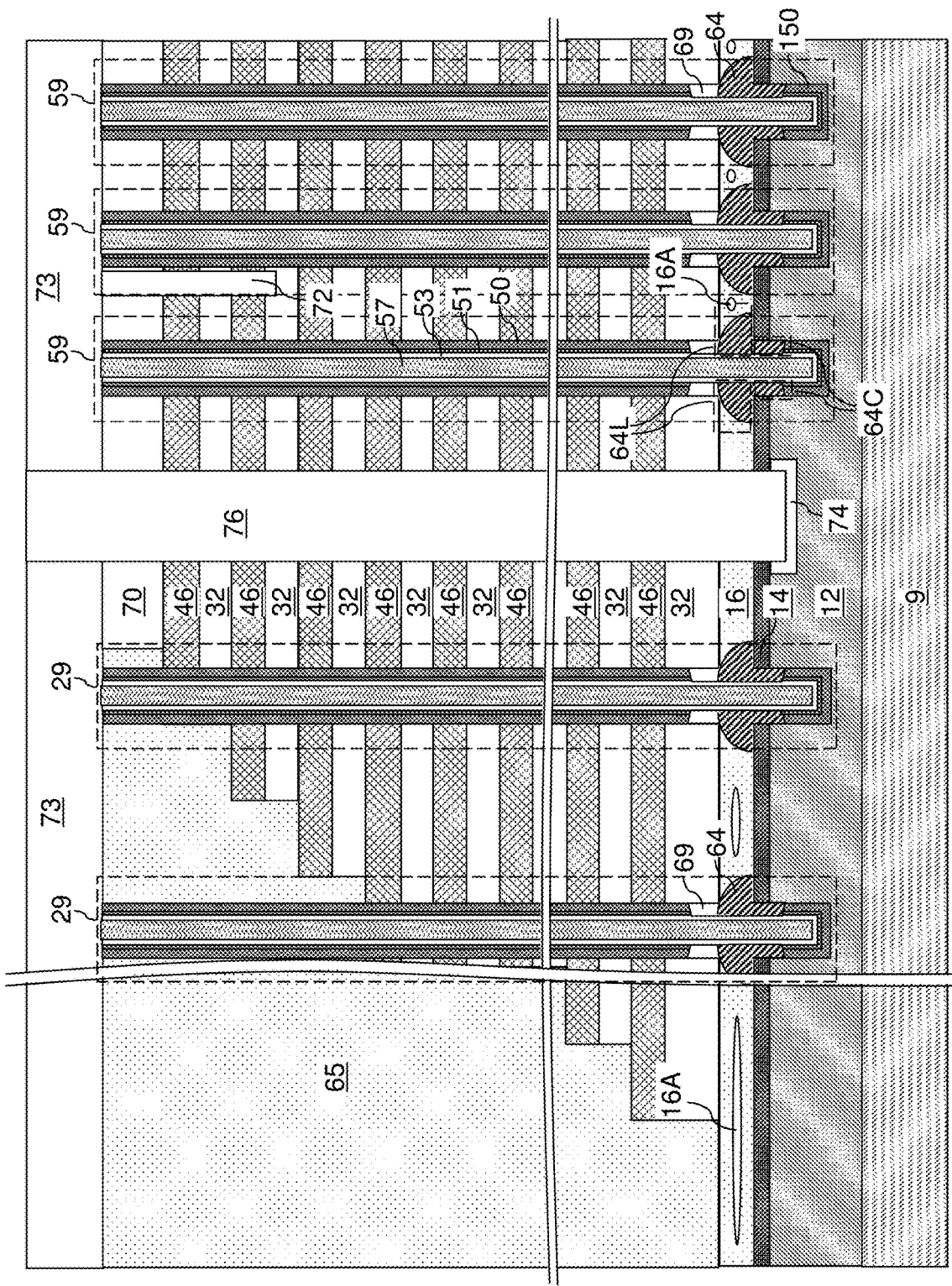
FIG. 15 is a schematic vertical cross-sectional view of an alternative configuration of the first exemplary structure after formation of backside trench fill structures according to the first embodiment of the present disclosure.

Referring to FIG. 15, an alternative configuration of the first exemplary structure is illustrated formation of backside trench fill structures 76. In this case, the alternative configuration of the first exemplary structure illustrated in FIG. 7 may be employed in lieu of the first exemplary structure illustrated in FIG. 6 during the manufacturing process.

Figure 16:
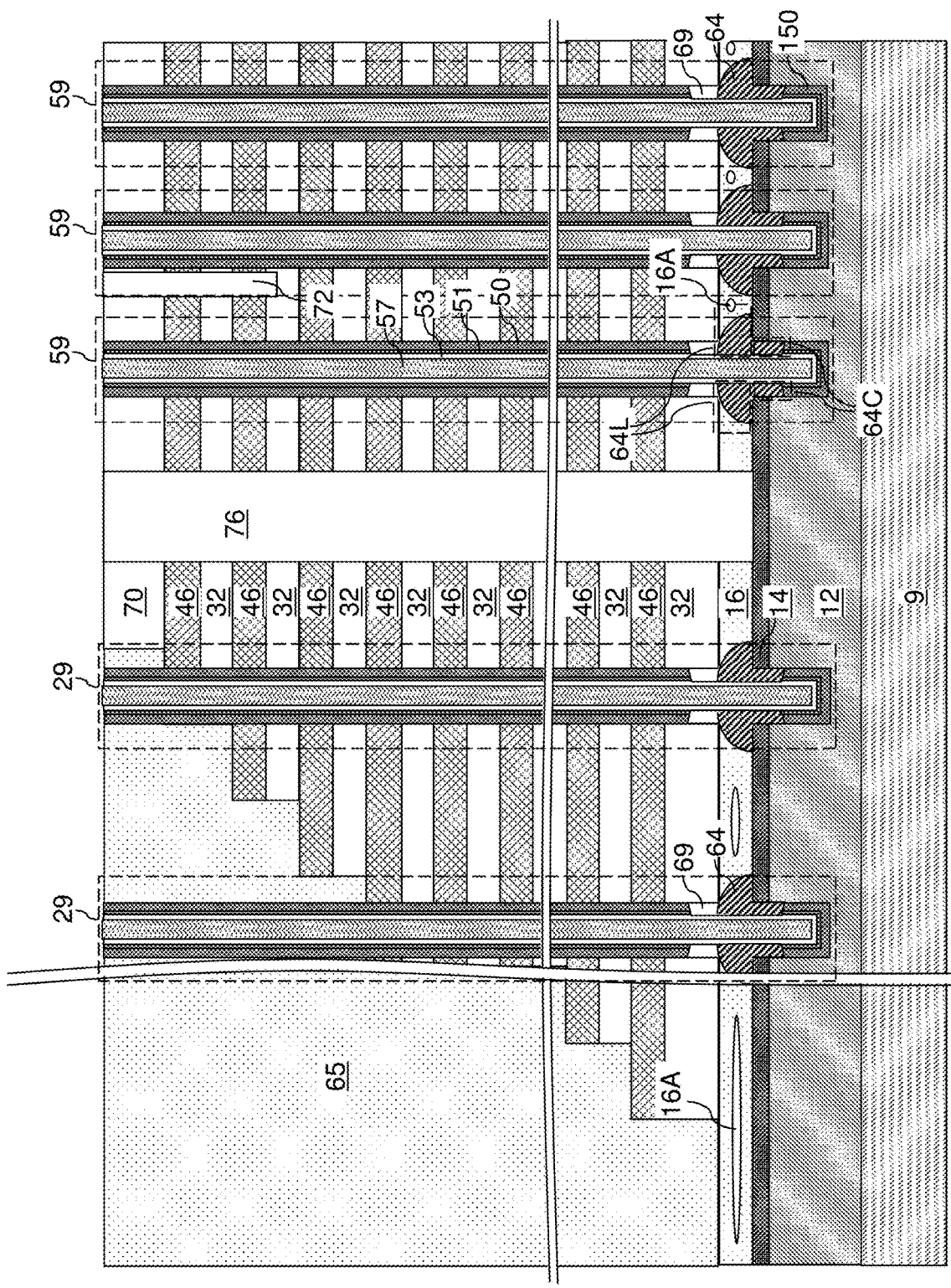
FIG. 16 is a schematic vertical cross-sectional view of the first exemplary structure after removal of a sacrificial capping layer according to the first embodiment of the present disclosure.

Referring to FIG. 16, the sacrificial capping layer 73 and an upper portion of each of the backside trench fill structures 76 may be removed. For example, a recess etch process or a chemical mechanical polishing process may be performed to remove the sacrificial capping layer 76 and the portions of the backside trench fill structures 76 located above the horizontal plane including the top surfaces of the sacrificial memory opening fill structures 59 and a sacrificial support opening fill structures 29.

Figure 17:
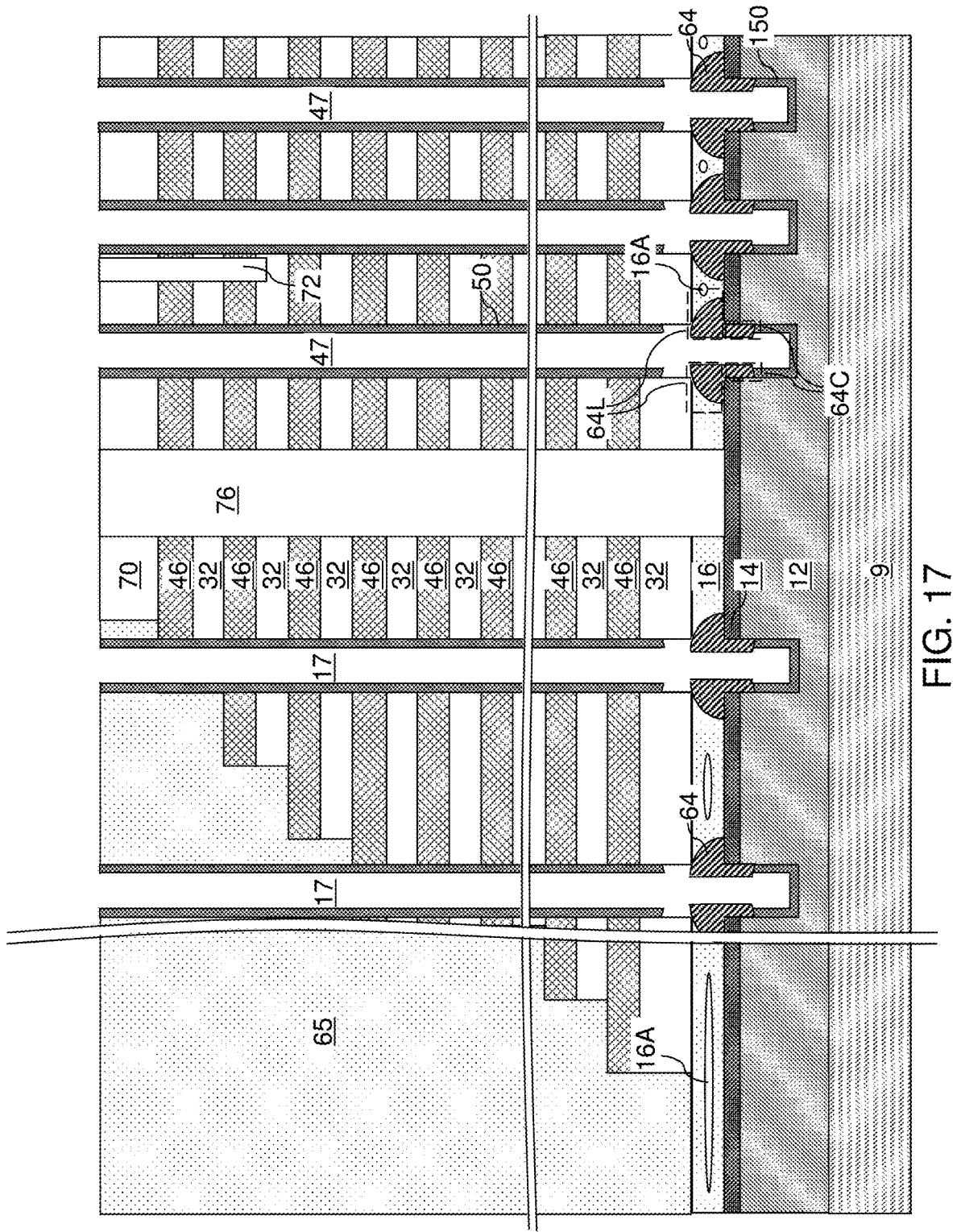
FIG. 17 is a schematic vertical cross-sectional view of the first exemplary structure after removal of the sacrificial opening fill material portions and etch stop liners according to the first embodiment of the present disclosure.

Referring to FIG. 17, a first selective etch process can be performed to etch the material of the sacrificial opening fill material portions 57 selective to the material of the inner etch stop liners 53. For example, if the sacrificial opening fill material portions 57 comprise polysilicon or amorphous silicon, and if the inner etch stop liners 53 comprise silicon oxide, then the sacrificial opening fill material portions 57 can be removed selective to the inner etch stop liners 53 by performing a wet etch process using hot trimethyl-2 hydroxyethyl ammonium hydroxide ("hot TMY") or tetramethyl ammonium hydroxide (TMAH). Alternatively, if the sacrificial opening fill material portions 57 comprise carbon, then they may be removed by ashing.

Subsequently, a second selective etch process can be performed to etch the material of the inner etch stop liners 53 selective to the material of the outer etch stop liners 51. For example, if the inner etch stop liners 53 comprise silicon oxide and if the outer etch stop liners 51 comprise amorphous silicon or polysilicon, then a wet etch process employing dilute hydrofluoric acid may be performed to etch the inner etch stop liners 53 selective to the outer etch stop liners 51.

Further, a third selective etch process can be performed to etch the material of the outer etch stop liners 51 selective to the material of the innermost layer of each memory film 50 (such as the memory liner layer 56). For example, if the outer etch stop liners 51 comprise amorphous silicon or polysilicon, and if the memory liner layer 56 comprises silicon oxide or silicon oxynitride, then a wet etch process employing dilute trimethyl-2 hydroxyethyl ammonium hydroxide ("hot TMY") or dilute tetramethyl ammonium hydroxide (TMAH) may be performed. Physically exposed surface portions of the coreless epitaxial semiconductor pedestals 64 may be collaterally recessed by a distance that is less than the thickness of the outer etch stop liners 51.

A memory cavity 47 can be formed within the volume of each memory opening 49. Each memory cavity 47 can be laterally surrounded by a respective memory film 50 and by a respective coreless epitaxial semiconductor pedestal 64. A support cavity 17 can be formed within the volume of each support opening 19. Each support cavity 17 can be laterally surrounded by a respective memory film 50 and by a respective coreless epitaxial semiconductor pedestal 64. Each coreless epitaxial semiconductor pedestal 64 may comprise a respective cylindrical surface that is physically exposed to a respective one of the memory cavities 47 and the support cavities 17.

Figure 18:
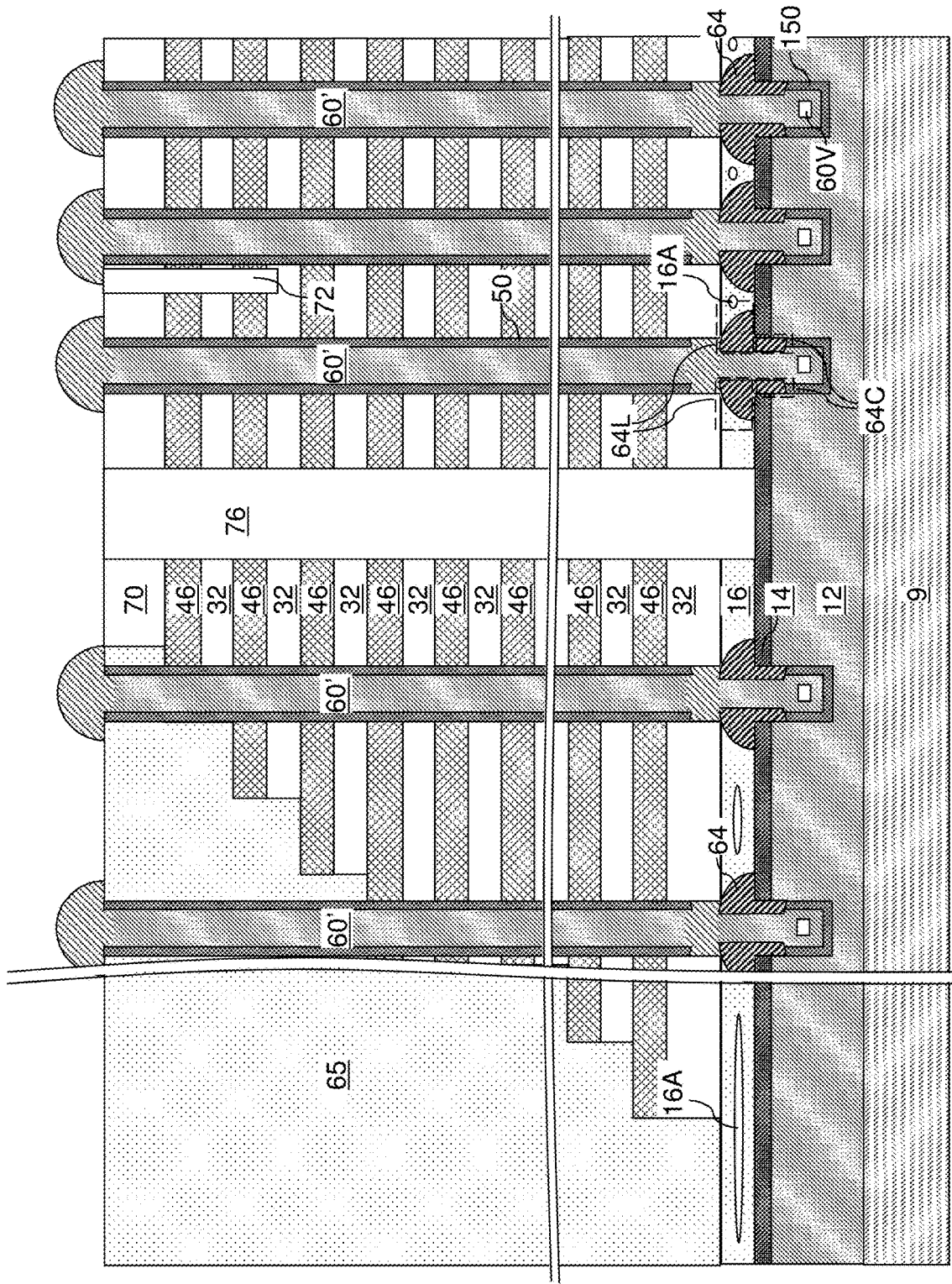
FIG. 18 is a schematic vertical cross-sectional view of the first exemplary structure after formation of epitaxial semiconductor columns according to the first embodiment of the present disclosure.

Referring to FIG. 18, a second selective epitaxy process can be performed to form epitaxial semiconductor columns 60' in the memory cavities 47 and the support cavities 17. The second selective epitaxy grows an epitaxial semiconductor material from the physically exposed surfaces (including the cylindrical surfaces) of the coreless epitaxial semiconductor pedestals 64. The first exemplary structure can be placed in a vacuum process chamber configured to perform the second selective epitaxy process. During the second selective epitaxy process, a reactant gas (which is a semiconductor precursor gas) and an etchant gas can be concurrently or alternately flowed into the process chamber. The reactant gas and the etchant gas can be selected based on the material composition of the epitaxial semiconductor material to be deposited. For example, the reactant gas may be selected from silane, disilane, dichlorosilane, and a trichlorosilane, and etchant gas may comprise gas phase hydrogen chloride. The deposition temperature and the flow rates of the reactant gas and the etchant gas can be selected such that the net growth rate (i.e., the deposition rate less the etch rate) of the deposited semiconductor material is positive on semiconductor surfaces (such as the physically exposed surfaces of the coreless epitaxial semiconductor pedestals 64), and is substantially zero on dielectric surfaces (such as the physically exposed surfaces of the memory films 50, the bottommost insulating layer 32, the insulating cap layer 70, and the stepped dielectric material portion 65.

The deposited single crystalline semiconductor material (e.g., single crystalline silicon) is in epitaxial alignment with the coreless epitaxial semiconductor pedestals 64, and forms the epitaxial semiconductor columns 60'. The epitaxial semiconductor columns 60' grow vertically within a respective one of the memory cavities 47 and the support cavities 17 and grow at least to the top surface of the insulating cap layer 70. The second selective epitaxy process may comprise an overgrowth step in which the epitaxial semiconductor columns 60' grow above the horizontal plane including the top surface of the insulating cap layer 70.

The epitaxial semiconductor columns 60' has a doping of a first conductivity type, which may be p-type or n-type. The atomic concentration of dopants of the first conductivity type in the epitaxial semiconductor columns 60' may be in a range from $1.0 \times 10^{14}/cm^3$ to $3.0 \times 10^{17}/cm^3$, although lesser and greater atomic concentrations may also be employed. The coreless epitaxial semiconductor pedestals 64 may have a doping of the first conductivity type. The doped single crystalline semiconductor material layer 12 may have a doping of the first conductivity type (and may function as a horizontal semiconductor channel), or may have a doping of a second conductivity type that is the opposite of the first conductivity type (and may function as a source layer).

Each memory film 50 can be vertically spaced from a respective underlying coreless epitaxial semiconductor pedestal 64 by a portion of a respective underlying epitaxial semiconductor column 60' that directly contacts a sidewall surface of one of the insulating layers 32 (such as the bottommost insulating layer 32) within the alternating stack (32, 46). In one embodiment, a cylindrical interface between each epitaxial semiconductor column 60' and the one of the insulating layers 32 (such as the bottommost insulating layer 32) within the alternating stack (32, 46) is vertically coincident with a cylindrical interface between a respective memory film 50 and the alternating stack (32, 46).

Each epitaxial semiconductor column 60' comprises a single crystalline semiconductor material (e.g., single crystalline silicon) that continuously extends through each electrically conductive layer 46 within the alternating stack (32, 46). The single crystalline semiconductor material (e.g., single crystalline silicon) of each epitaxial semiconductor column 60' is in epitaxial alignment with the single crystalline semiconductor material (e.g., single crystalline silicon) of a respective underlying coreless epitaxial semiconductor pedestal 64.

In one optional embodiment, one or more of the epitaxial semiconductor columns 60' embeds a void (e.g., airgap) 60V between a first horizontal plane including a proximal horizontal surface (such as the top surface) of the doped single crystalline semiconductor material layer 12 that is proximal to the alternating stack (32, 46) and a second horizontal plane including a distal horizontal surface (such as the bottom surface) of the doped single crystalline semiconductor material layer 12 this is distal from the alternating stack (32, 46). Alternatively, the void 60V may be omitted.

Figure 19:
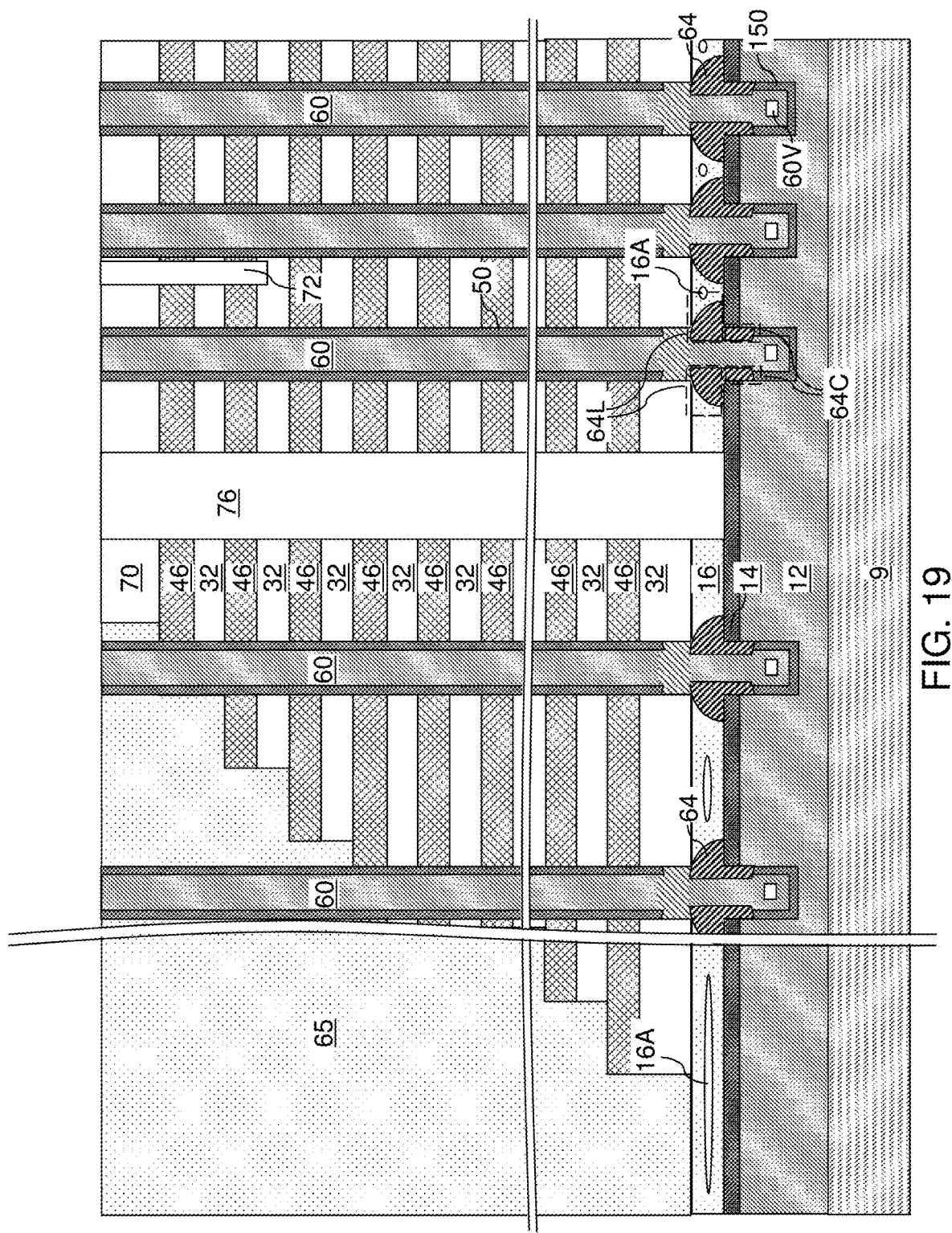
FIG. 19 is a schematic vertical cross-sectional view of the first exemplary structure after formation of epitaxial semiconductor channels according to the first embodiment of the present disclosure.

Referring to FIG. 19, a planarization process such as a chemical mechanical polishing process can be performed to remove excess portions of the epitaxial semiconductor columns 60' that are located above the horizontal plane including the top surface of the insulating cap layer 70. Each remaining portion of the epitaxial semiconductor columns 60' constitutes a vertical semiconductor channel 60, which is an epitaxial semiconductor channel consisting of a respective single crystalline semiconductor material portion (e.g., single crystalline silicon) in epitaxial alignment with a respective underlying coreless epitaxial semiconductor (e.g., single crystalline silicon) pedestal 64.

Each sacrificial memory opening fill structure 59 can be replaced with a set of material portions that comprise a vertical semiconductor channel 60, a memory film 50, and a coreless epitaxial semiconductor pedestal 64. The vertical semiconductor channel 60 contacts the memory film 50 and the epitaxial semiconductor material of the coreless epitaxial semiconductor pedestal 64. The single crystalline semiconductor material of the vertical semiconductor channel 60 is in epitaxial alignment with the single crystalline semiconductor material of the coreless epitaxial semiconductor pedestal 64 and with the single crystalline semiconductor material of the doped single crystalline semiconductor material layer 12.

In one embodiment, one or more of the vertical semiconductor channels 60 may embed a void 60V between a first horizontal plane including a proximal horizontal surface (such as the top surface) of the doped single crystalline semiconductor material layer 12 that is proximal to the alternating stack (32, 46) and a second horizontal plane including a distal horizontal surface (such as the bottom surface) of the doped single crystalline semiconductor material layer 12 this is distal from the alternating stack (32, 46).

Figure 20:
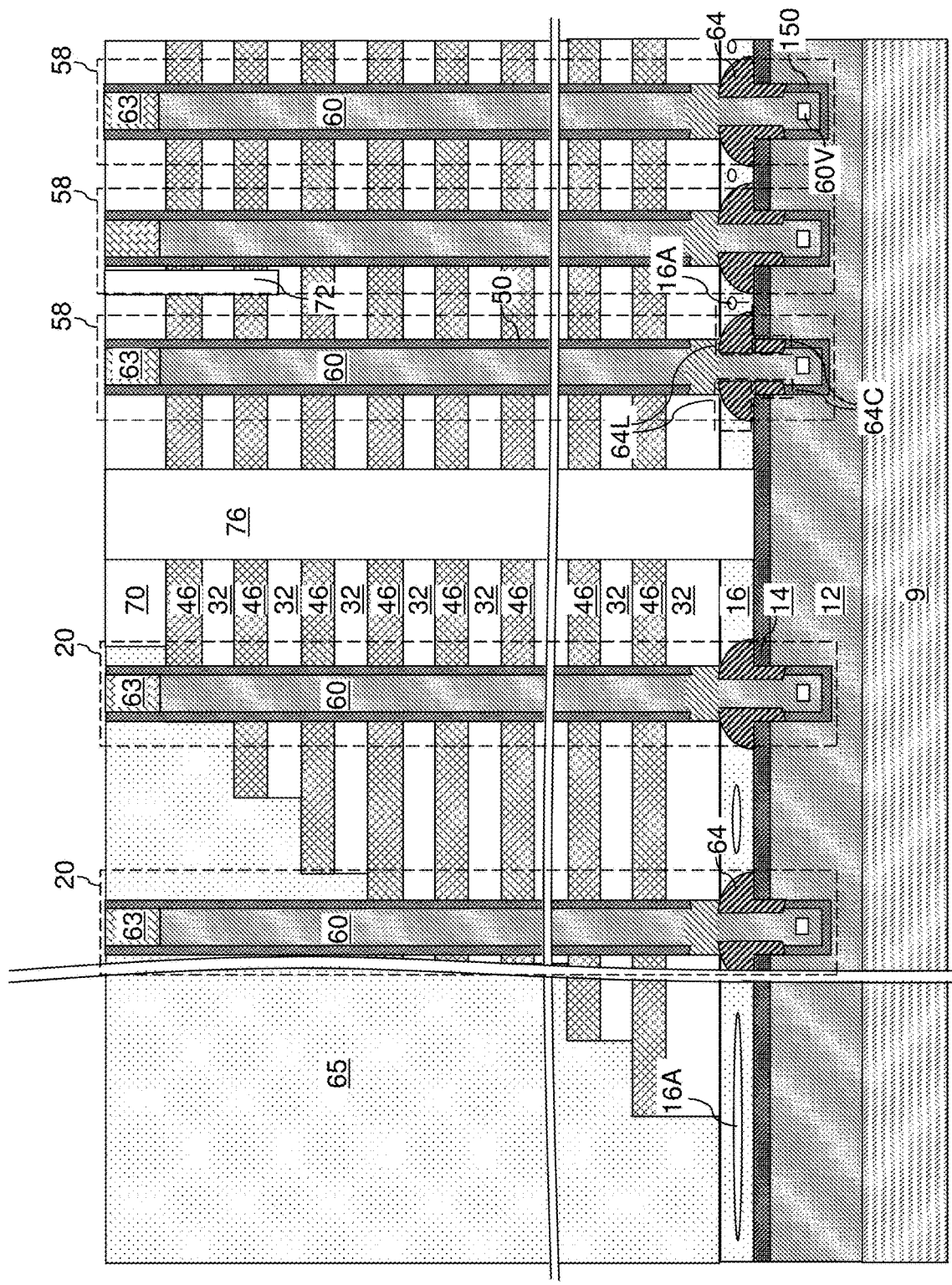
FIG. 20 is a schematic vertical cross-sectional view of the first exemplary structure after formation of drain regions according to the first embodiment of the present disclosure.

Referring to FIG. 20, dopants of the second conductivity type may be implanted into upper portions of the vertical semiconductor channels 60. The implanted portions of the vertical semiconductor channels 60 can be converted into drain region 63 having a doping of the second conductivity type. A p-n junction can be formed at each interface between a remaining portion of each vertical semiconductor channel 60 and an overlying drain region 63. Each drain region 63 can be single crystalline, and can be in epitaxial alignment with the single crystalline material of the respective underlying vertical semiconductor channel 60. A set of all material portions located within a memory opening 49 constitutes a memory opening fill structure 58. Each memory opening fill structure 58 comprises a drain region 63 located at an end of a vertical semiconductor channel 60 that is distal from the doped single crystalline semiconductor material layer 12. A set of all material portions located within a support opening 19 constitutes a support pillar structure 20.

Figure 21A:
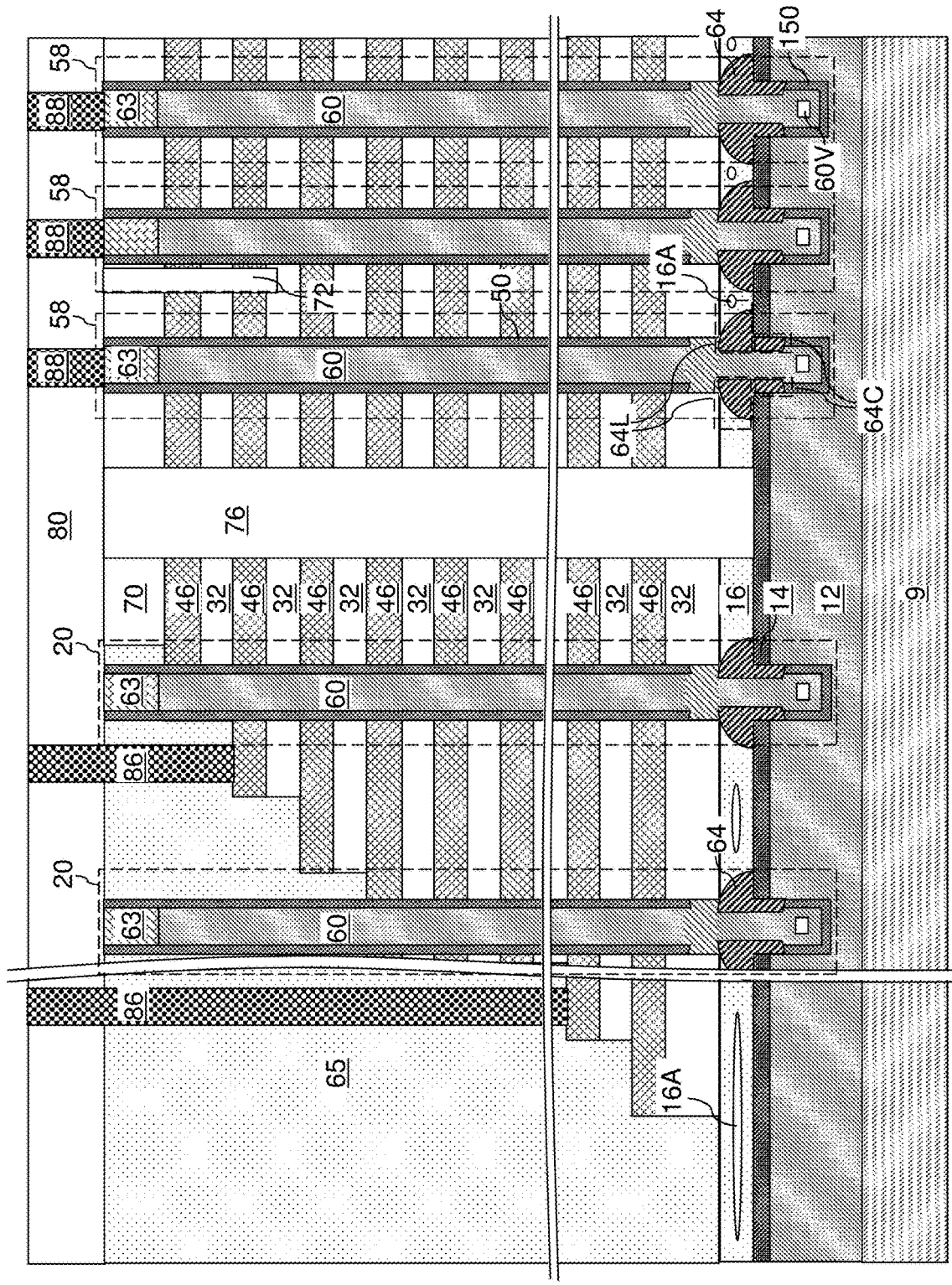
FIG. 21A is a schematic vertical cross-sectional view of the first exemplary structure after formation of contact via structures according to the first embodiment of the present disclosure.
Figure 21B:
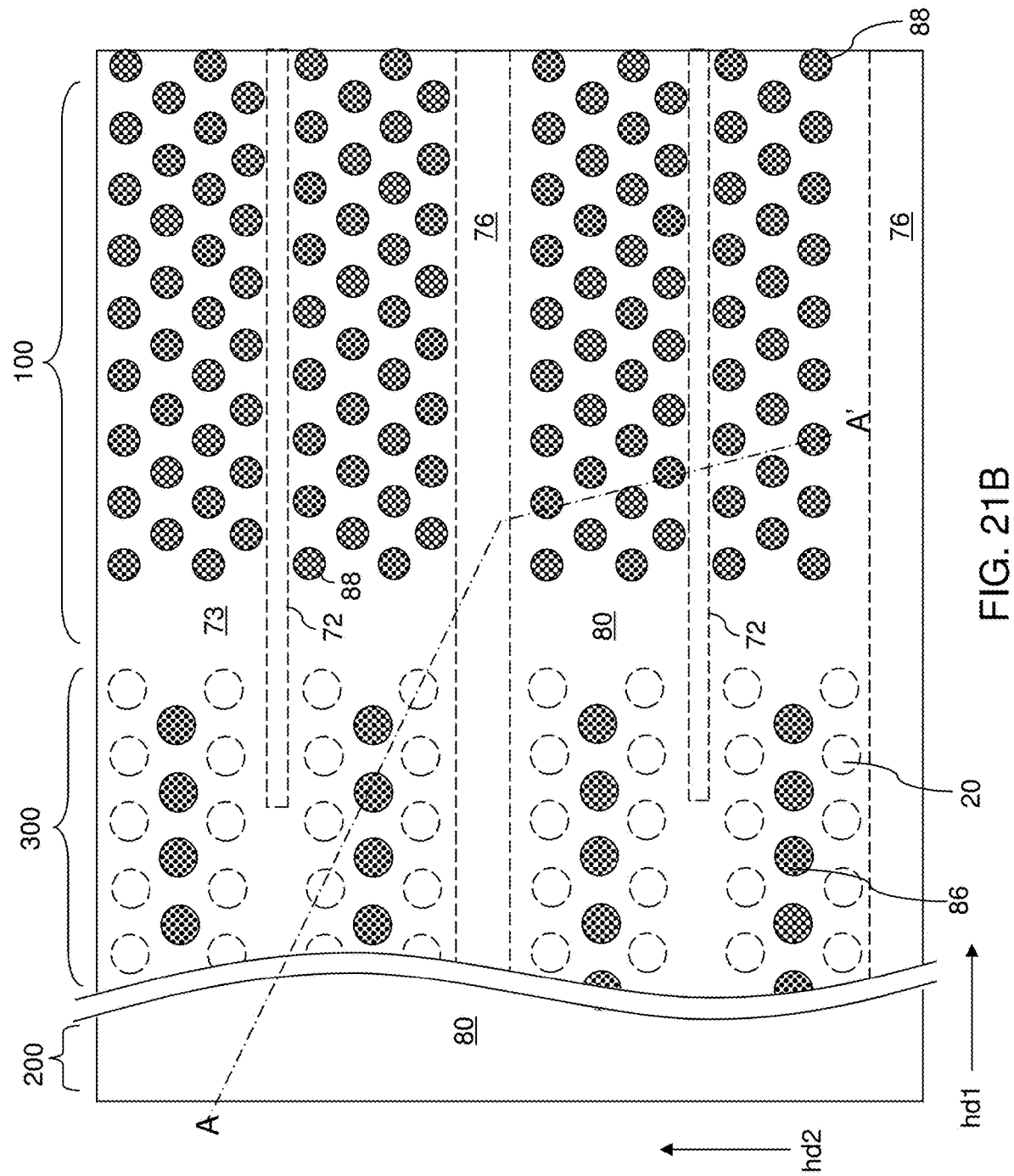
FIG. 21B is a top-down view of the first exemplary structure of FIG. 21A. The vertical plane A-A' is the plane of the schematic vertical cross-sectional view of FIG. 21A.

Referring to FIGS. 21A and 21B, a contact-level dielectric layer 80 can be formed over the insulating cap layer 70 and the stepped dielectric material portion 65. The contact-level dielectric layer 80 comprises a dielectric material such as silicon oxide. The thickness of the contact-level dielectric layer 80 may be in a range from 100 nm to 600 nm, although lesser and greater thicknesses may also be employed.

Contact via structures (88, 86) can be formed through the contact-level dielectric layer 80, and optionally through the stepped dielectric material portion 65. For example, drain contact via structures 88 can be formed through the contact-level dielectric layer 80 on each drain region 63. Word line contact via structures 86 can be formed on the electrically conductive layers 46 through the contact-level dielectric layer 80, and through the stepped dielectric material portion 65. Pass-through via structures (not shown) can be formed through the stepped dielectric material portion 65.

Figure 22:
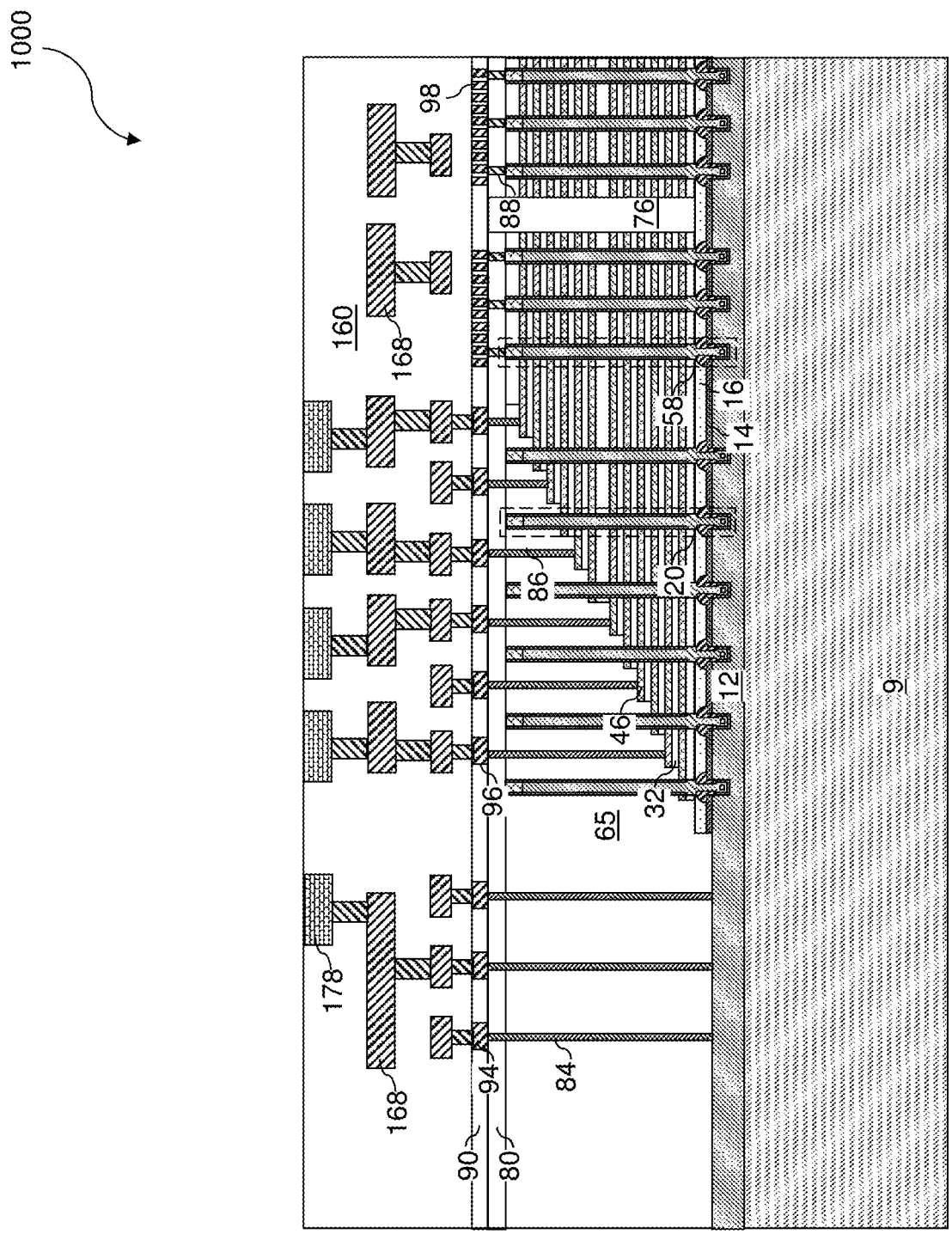
FIG. 22 is a schematic vertical cross-sectional view of the first exemplary structure that after formation of a first semiconductor die according to the first embodiment of the present disclosure.

Referring to FIG. 22, a first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88, word-line-connection metal interconnect lines 96 that are electrically connected to a respective one of the word line contact via structures 86, and peripheral metal interconnect lines 94 that are electrically connected to a respective one of the pass-through via structures 84. The bit lines 98 are electrically connected to upper ends of a respective subset of the vertical semiconductor channels 60 in the memory stack structures 55 in the memory array region 100 via a respective subset of the drain regions 63. The drain regions 63 are located at end portions of the vertical semiconductor channels 60 that are distal from the semiconductor material layer 14 and the dielectric isolation layer 12. In one embodiment, the memory stack structures 55 are arranged in rows that extend along the first horizontal direction (e.g., word line direction) hd1, and the bit lines 98 laterally extend along the second horizontal direction (e.g., bit line direction) hd2.

A first semiconductor die (which may be a memory die) 1000 is provided by performing additional processing steps on the first exemplary structure. Specifically, additional metal interconnect structures 168 included in additional interconnect level dielectric layers 160 are formed. In an illustrative example, the additional interconnect level dielectric layers 160 can include a via level dielectric layer, a second line level dielectric layer, a second via level dielectric layer, and a metallic pad structure level dielectric layer. The metal interconnect structures 168 can include first metal via structures included in the first via level dielectric layer, second metal line structures included within the second line level dielectric layer, second metal via structures included in the second via level dielectric layer, and first bonding structures 178 (such as metallic pad structures) included in the metallic pad structure level dielectric layer 140. While the present disclosure is described using an example in which the additional interconnect level dielectric layers 160 include the first via level dielectric layer, the second line level dielectric layer, the second via level dielectric layer, and the metallic pad structure level dielectric layer, embodiments are expressly contemplated herein in which the additional interconnect level dielectric layers 160 include a different number and/or different combinations of dielectric material layers. The first semiconductor die 1000 may be a memory die that includes a three-dimensional array of memory elements. Electrical connection paths can be provided by each combination of a first bonding structure 178 and a respective set of metal interconnect structures.

Figure 23:
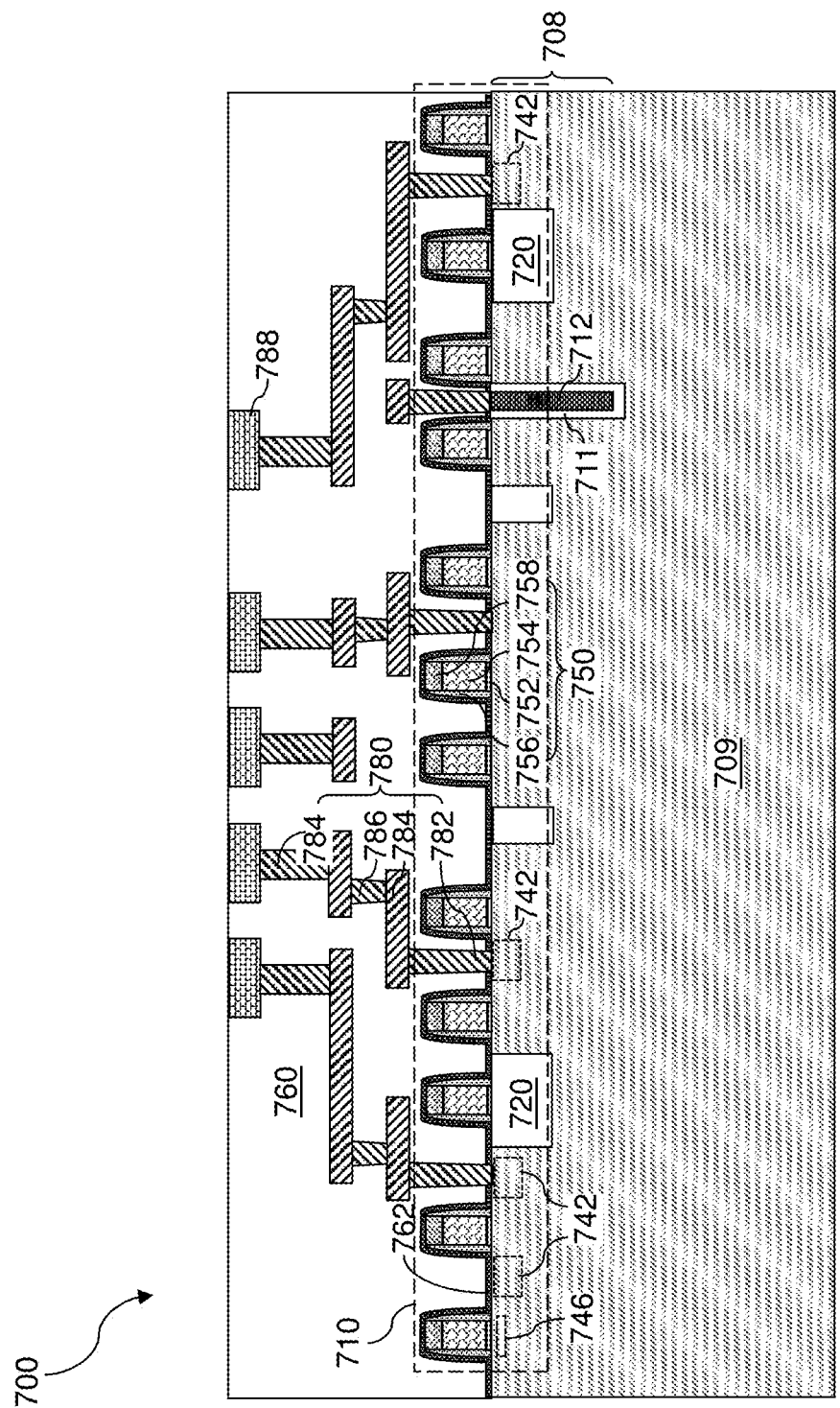
FIG. 23 is a schematic vertical cross-sectional view of a second semiconductor die according to the first embodiment of the present disclosure.

Referring to FIG. 23, a second semiconductor die 700 can be provided, which can be a logic die including various semiconductor devices 710. In one embodiment, the second semiconductor die 700 comprises a peripheral (e.g., driver) circuitry containing peripheral devices configured to control operation of the three-dimensional array of memory elements in the first semiconductor die 1000. The peripheral circuitry can include a word line driver that drives the electrically conductive layers (e.g., word lines) 46 within the first semiconductor die 1000, a bit line driver that drives the bit lines 98 in the first semiconductor die 1000, a word line decoder circuitry that decodes the addresses for the electrically conductive layers 46, a bit line decoder circuitry that decodes the addresses for the bit lines 98, a sense amplifier circuitry that senses the states of memory elements within the memory stack structures 55 in the first semiconductor die 1000, a power supply/distribution circuitry that provides power to the first semiconductor die 1000, a data buffer and/or latch, and/or any other semiconductor circuitry that can be used to operate the array of memory stack structures 58 in the first semiconductor die 1000.

The second semiconductor die 700 can include a logic-die substrate 708, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. In one embodiment, combinations of a through-substrate insulating liner 711 and a through-substrate connection via structure 712 may be formed in an upper portion of the substrate semiconductor layer 709.

Shallow trench isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the first semiconductor die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and second bonding structures 788 (such as metallic pad structures) that may be configured to function as bonding pads. Generally, the second semiconductor die 700 comprises second bonding structures 788 that overlie, and are electrically connected to, the semiconductor devices 710.

Figure 24:
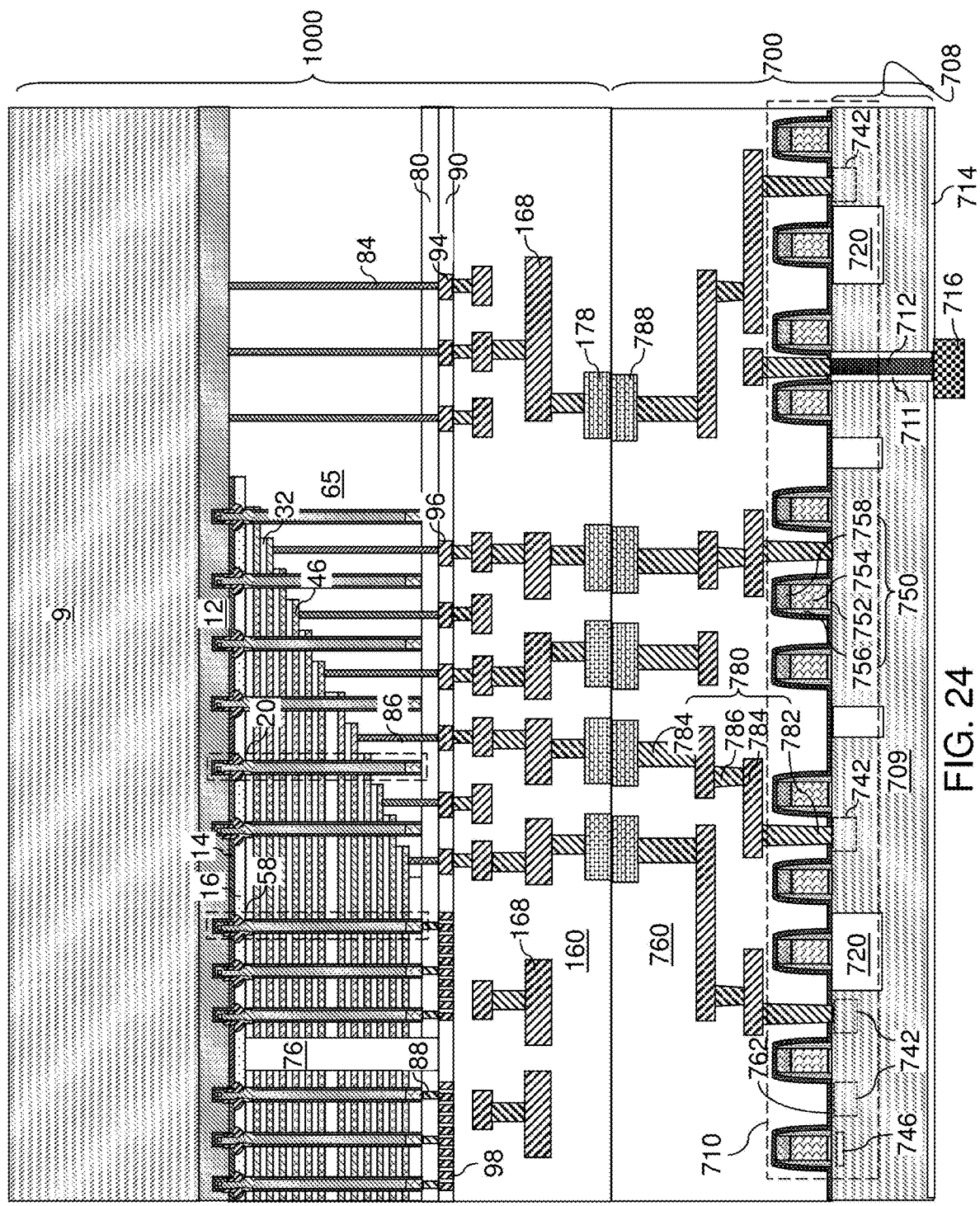
FIG. 24 is a schematic vertical cross-sectional view of a bonded assembly of the first semiconductor die and the second semiconductor die according to the first embodiment of the present disclosure.

Referring to FIG. 24, the first semiconductor die 1000 and the second semiconductor die 700 are positioned such that the second bonding structures 788 of the second semiconductor die 700 face the first bonding structures 178 of the first semiconductor die 1000. In one embodiment, the first semiconductor die 1000 and the second semiconductor die 700 can be designed such that the pattern of the second bonding structures 788 of the second semiconductor die 700 is the mirror pattern of the pattern of the first bonding structures 178 of the first semiconductor die 1000. The first semiconductor die 1000 and the second semiconductor die 700 can be bonded to each other by metal-to-metal bonding. Alternatively, an array of solder material portions may be used to bond the first semiconductor die 1000 and the second semiconductor die 700 through the array of solder material portions (such as solder balls).

In the case of metal-to-metal bonding, facing pairs of a first bonding structure 178 of the first semiconductor die 1000 and a second bonding structure 788 of the second semiconductor die 700 can be brought to direct contact with each other, and can be subjected to an elevated temperature to induce material diffusion across the interfaces between adjoined pairs of metallic pad structures (178, 788). The interdiffusion of the metallic material can induce bonding between each adjoined pairs of metallic pad structures (178, 788). In addition, the logic-side dielectric layers 760 and the interconnect level dielectric layers 160 can include a dielectric material (such as a silicate glass material) that can be bonded to each other. In this case, physically exposed surfaces of the logic-side dielectric layers 760 and the interconnect level dielectric layers 160 can be brought to direct contact with each other and can be subjected to thermal annealing to provide additional bonding.

In case an array of solder material portions is used to provide bonding between the first semiconductor die 1000 and the second semiconductor die 700, a solder material portion (such as a solder ball) can be applied to each of the first bonding structures 178 of the first semiconductor die 1000, and/or to each of the second bonding structures 788 of the second semiconductor die 700. The first semiconductor die 1000 and the second semiconductor die 700 can be bonded to each other through an array of solder material portions by reflowing the solder material portions while each solder material portion is contacted by a respective pair of a first bonding structure 178 of the first semiconductor die 1000 and a second bonding structure 788 of the second semiconductor die 700.

Generally, a second semiconductor die 700 can be bonded to a first semiconductor die 1000. The first semiconductor die 1000 comprises an array of memory stack structures 55, and the logic die 1000 comprises a complementary metal oxide semiconductor (CMOS) circuit that includes a peripheral circuitry electrically coupled to nodes of the array of memory stack structures 55 through a subset of metal interconnect structures 168 included within the first semiconductor die 1000. The first semiconductor die 1000 includes the semiconductor material layer 14, and is attached to the carrier substrate 9.

Optionally, the substrate semiconductor layer 709 (which may be a silicon wafer) of the second semiconductor die 700 can be thinned from the backside. For example, a combination of grinding, polishing, and/or chemical etching may be employed to remove portions of the substrate semiconductor layer 709 that are distal from the interface between the first semiconductor die 1000 and the second semiconductor die 700. Surfaces of the through-substrate contact via structures 712 can be physically exposed after thinning the substrate semiconductor layer 709. A backside insulating layer 714 can be formed on the backside surface of the logic die substrate 708 (as thinned after the thinning process). Optional laterally-insulated through-substrate via structures (711, 712) can vertically extend through the logic die substrate 708 to provide electrical contact to various input nodes and output nodes of the periphery circuitry in the second semiconductor die 700. Each laterally-insulated through-substrate via structure (711, 712) includes a through-substrate connection via structure 712 and a through-substrate insulating liner 711 that laterally surrounds the through-substrate conductive via structure 712. Logic-side bonding pads 716 (which is also referred to as front bonding pads) can be formed on surface portions of the laterally-insulated through-substrate via structures (711, 712). Generally, a semiconductor die is provided, which includes semiconductor devices 710 located on a semiconductor substrate (such as the substrate semiconductor layer 709). The second bonding structures 788 overlie, and are electrically connected to, the semiconductor devices 710, and laterally-insulated through-substrate via structures (711, 712) can extend through the logic-side substrate 708. Thus, in one embodiment, the laterally-insulated through-substrate via structure (711, 712) and the logic-side bonding pads 716 may be omitted. Alternatively, the substrate semiconductor layer (e.g., the silicon wafer) 709 of the second semiconductor die 700 may be retained in the device and the logic-side bonding pads 716 and the laterally-insulated through-substrate via structures (711, 712) are omitted.

The bonded assembly of the first semiconductor die 1000 and the second semiconductor die 700 may comprise a bonded assembly of a memory die and a logic die. Within the bonded assembly, the doped single crystalline semiconductor material layer 12 is located on a distal side of the alternating stack of the insulating layers 32 and the electrically conductive layers 46. As used herein, a distal surface of an element within a bonded assembly of two semiconductor dies refers to a surface of the element that is distal from the interface between the two semiconductor dies such as the interface between the first semiconductor die 1000 and the second semiconductor die 700. The doped single crystalline semiconductor material layer 12 is more distal from the second semiconductor die 700 (i.e., the logic die) than the alternating stack (32, 46) is from the second semiconductor die 700. The dielectric isolation layer 16 may be disposed between the alternating stack (32, 46) and the doped single crystalline semiconductor material layer 12. The carrier substrate 9 is located on a distal surface of the doped single crystalline semiconductor layer 12. Memory openings 49 (filled with the memory opening fill structures 58) vertically extend through the alternating stack (32, 46) and the dielectric isolation layer 16, and extend into a proximal portion of the doped single crystalline semiconductor material layer 12. Memory opening fill structures 58 are located in the memory openings 49, and comprise a respective vertical semiconductor channel 60 and a respective memory film 50.

Figure 25:
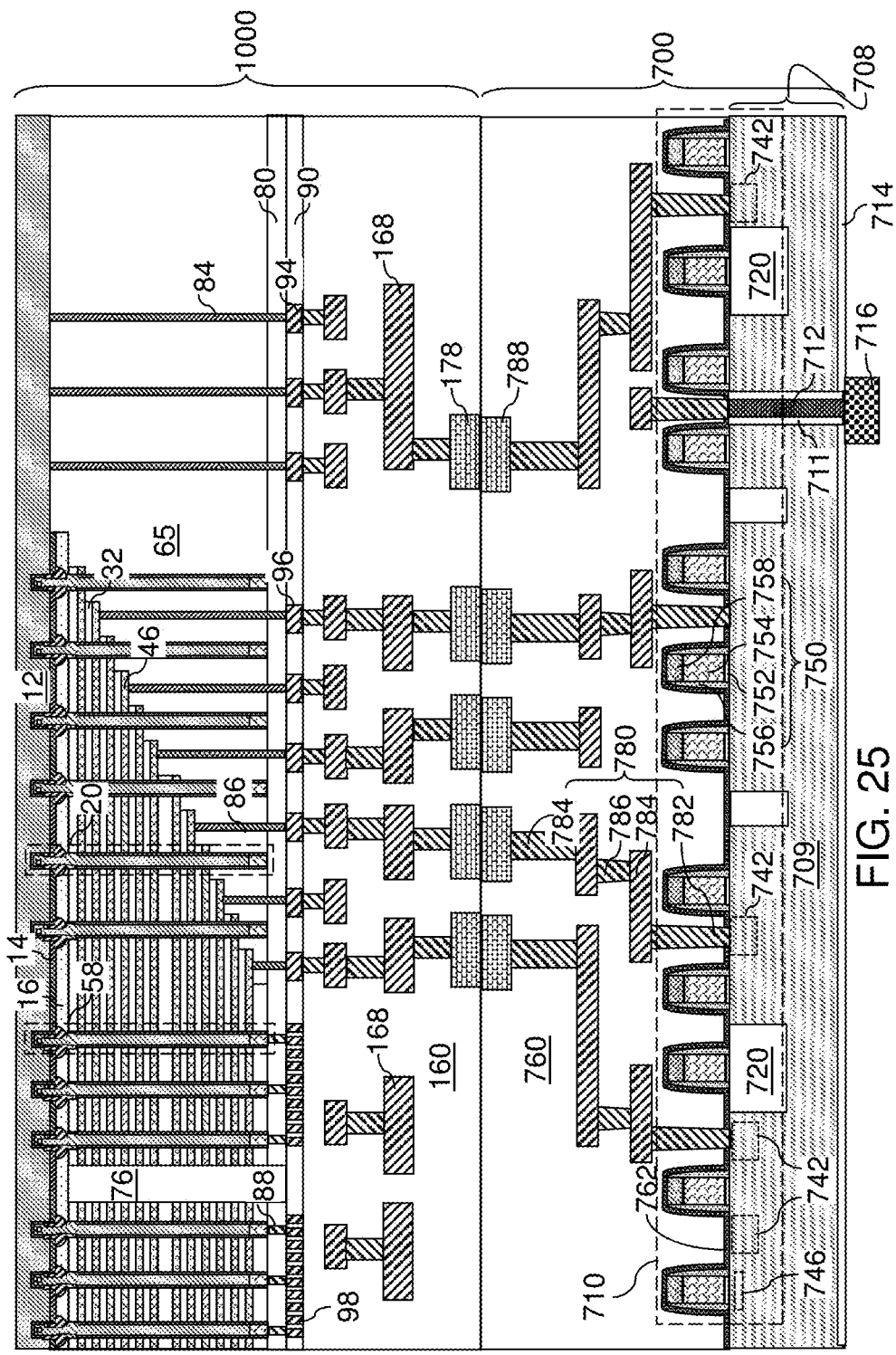
FIG. 25 is a schematic vertical cross-sectional view of the bonded assembly after removal of the carrier substrate according to the first embodiment of the present disclosure.

Referring to FIG. 25, the carrier substrate 9 may be removed while retaining the doped single crystalline semiconductor material layer 12, the dielectric isolation layer 16, the memory opening fill structures 58, and the backside trench fill structures 76. For example, if the carrier substrate 9 comprises a semiconductor substrate (such as a silicon wafer), a grinding process may be performed to remove a predominant portion of the carrier substrate 9 from the backside, a polishing process may be performed to remove a proximal portion of the carrier substrate 9 that is proximal to the interface between the first semiconductor die 1000 and the second semiconductor die 700, and an isotropic wet etch process employing an etchant that etches the semiconductor material of the carrier substrate 9 without excessively thinning the doped single crystalline semiconductor material layer 12. In an illustrative example, the wet etch process may employ KOH as an etchant. Generally, the carrier substrate 9 can be removed after formation of the vertical semiconductor channels 60. A distal planar surface of the doped single crystalline semiconductor material layer 12 can be physically exposed upon removal of the carrier substrate 9.

Figure 26:
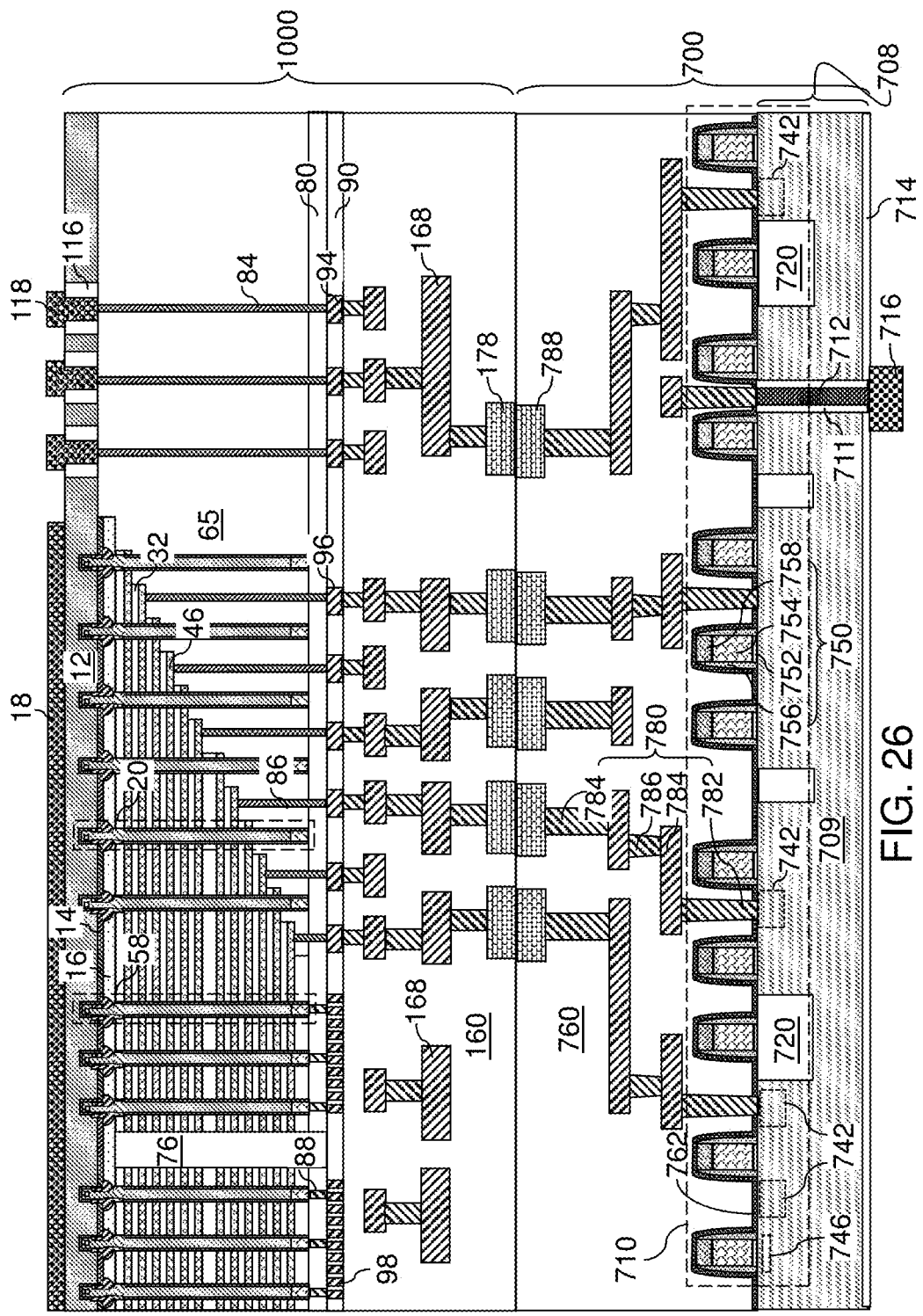
FIG. 26 is a schematic vertical cross-sectional view of the bonded assembly after formation of backside metallic contact structures according to the first embodiment of the present disclosure.

Referring to FIG. 26, a photoresist layer (not shown) may be applied over the doped single crystalline semiconductor material layer 12, and can be lithographically patterned to form openings in areas that overlie the pass-through via structures 84. An anisotropic etch process can be performed to form openings through the doped single crystalline semiconductor material layer 12. End surfaces of the pass-through via structures 84 can be physically exposed underneath the openings through the doped single crystalline semiconductor material layer 12. A dielectric material, such as silicon oxide can be conformally deposited over the doped single crystalline semiconductor material layer 12, and an anisotropic etch process can be performed to remove horizontally-extending portions of the dielectric material. Remaining cylindrical portions of the dielectric material constitute dielectric spacers 116.

At least one metallic material can be deposited on the physically exposed as surfaces of the pass-through via structures 84 and over the distal surface of the doped single crystalline semiconductor material layer 12. The at least one metallic material may comprise an optional metallic nitride barrier material (such as TiN, TaN, WN, or MoN) and a high-conductivity metallic material (which may include an elemental metal such as Al, W or Cu, or a metal alloy). The at least one metallic material can be subsequently patterned by a combination of lithographic methods and an etch process (which may employ an anisotropic etch process or an isotropic etch process). Patterned portions of the at least one metallic material may comprise backside metallic contact structures (18, 118). The backside metallic contact structures (18, 118) may comprise an electrically conductive (e.g., metal or metal alloy, such as aluminum) source contact layer 18 contacting the backside surface (i.e., the distal surface) of the doped single crystalline semiconductor material layer 12, and metallic pad structures 118 contacting a respective one of the pass-through via structures 84.

Figure 27:
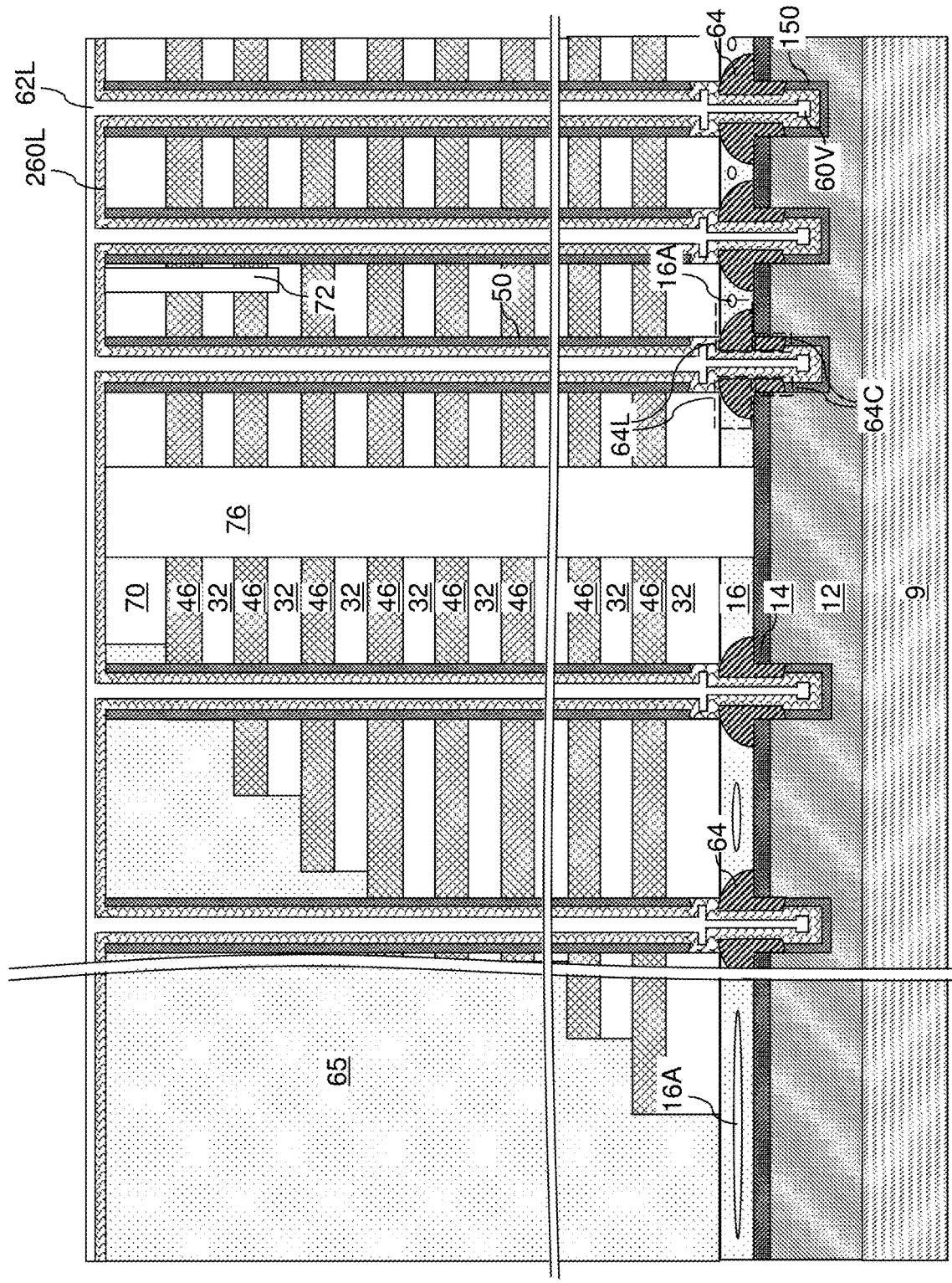
FIG. 27 is a schematic vertical cross-sectional view of a second exemplary structure after formation of a semiconductor channel material layer and a dielectric fill material layer according to a second embodiment of the present disclosure.

Referring to FIG. 27, a second exemplary structure according to a second embodiment of the present disclosure can be derived from the first exemplary structure illustrated in FIG. 17 by conformally depositing a semiconductor channel material layer 260L and by depositing a dielectric core material layer 62L within each of the memory cavities 47 and the support cavities 17. In this case, the semiconductor channel material layer 260L can be deposited by a non-selective conformal semiconductor deposition process such as a low-pressure chemical vapor deposition (LPCVD) process. The semiconductor channel material layer 260L can include a polycrystalline semiconductor material having a doping of a first-conductivity-type. For example, the semiconductor channel material layer 260L may comprise polysilicon. Alternatively, the semiconductor channel material layer 260L may comprise amorphous silicon. The coreless epitaxial semiconductor pedestals 64 is epitaxial, and has a doping of the first-conductivity-type.

The dielectric core material layer 62L includes a dielectric fill material such as a silicon oxide. The dielectric core material layer 62L can be deposited in unfilled volumes of the memory cavities 47 and the support cavities 17 by a conformal deposition processes such as a chemical vapor deposition process.

Figure 28:
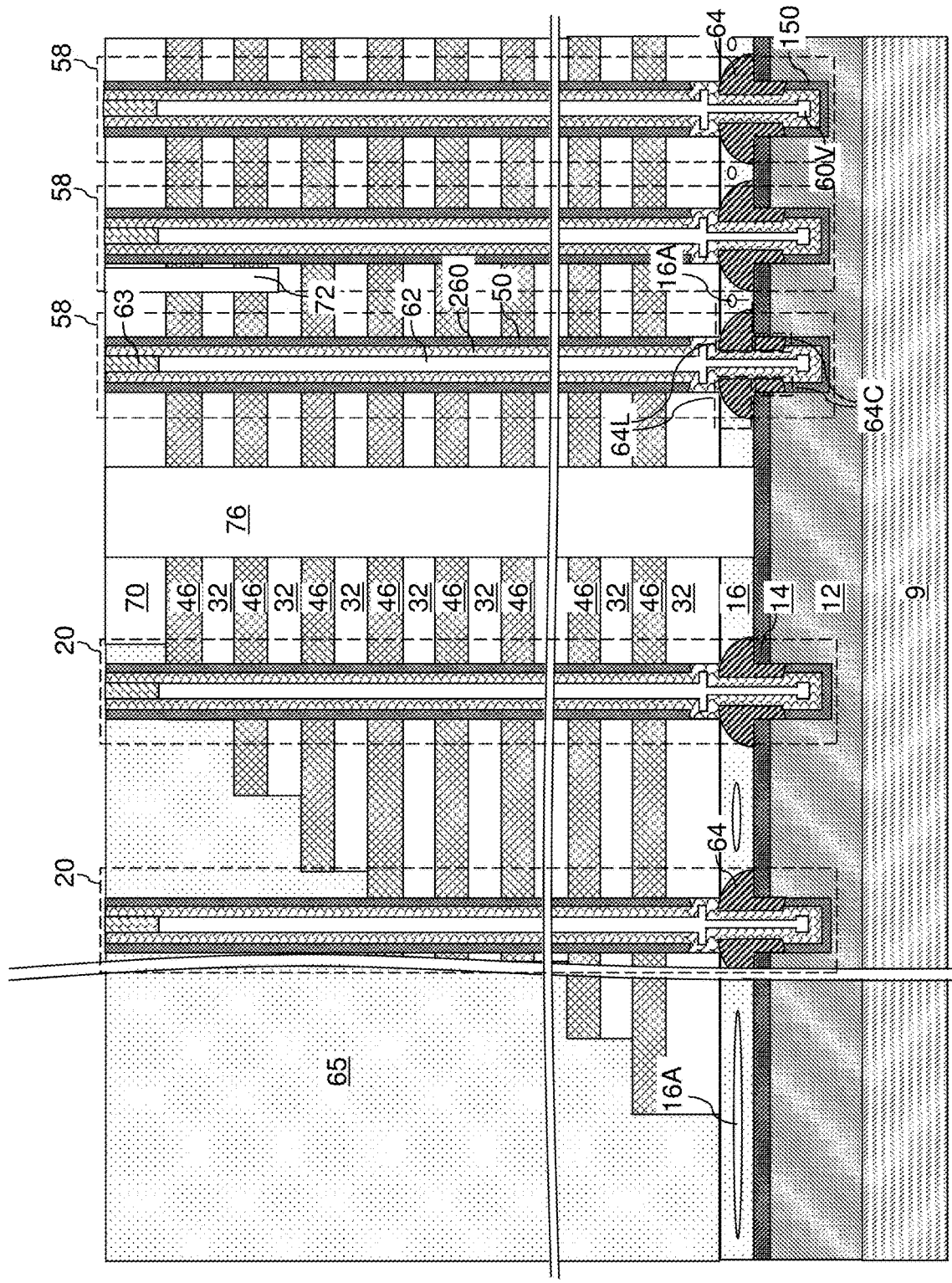
FIG. 28 is a schematic vertical cross-sectional view of the second exemplary structure after formation of memory opening fill structures and support pillar structures according to the second embodiment of the present disclosure.

Referring to FIG. 28, the dielectric core material layer 62L can be vertically recessed, for example, by performing a recess etch process. The duration of the recess etch process can be selected such that each remaining portion of the dielectric core material layer 62 has a top surface located at, or about, the horizontal plane including the bottom surface of the insulating cap layer 70. Each remaining portion of the dielectric core material layer 62L constitutes a dielectric core 62.

A doped semiconductor material having a doping of a second conductivity type can be deposited in recess cavities overlying the dielectric cores 62. The second conductivity type is the opposite of the first-conductivity-type. Portions of the deposited doped semiconductor material and the semiconductor channel material layer 260L located above the top surface of the insulating cap layer 70 can be removed by a planarization process, which may employ a recess etch process or a chemical mechanical polishing process. Each remaining portion of the deposited doped semiconductor material constitutes a drain region 63 having a doping of the second conductivity type. The atomic concentration of dopants of the second conductivity type in the drain regions 63 may be in a range from $5.0\times10^{18}/cm^3$ to $2.0\times10^{21}/cm^3$, although lesser and greater atomic concentrations may also be employed. Each remaining portion of the semiconductor channel material layer 260L that remains in a respective one of the memory openings 49 and the support openings 19 constitutes a vertical semiconductor channel 260 including a polycrystalline or amorphous a semiconductor material. Each vertical semiconductor channel 260 continuously extends through each electrically conductive layer 46 within the alternating stack (32, 46). Each dielectric core 62 vertically extends through the alternating stack (32, 46), the dielectric isolation layer 16, and a portion of the doped single crystalline semiconductor material layer 12 that is proximal to the dielectric isolation layer 16, and is laterally surrounded by a respective vertical semiconductor channel 260.

Referring to FIG. 29, the processing steps of FIGS. 21A-28 can be subsequently performed to provide the second exemplary structure.

Referring to all drawings and according to various embodiments of the present disclosure, a semiconductor structure is provided, which comprises: a doped single crystalline semiconductor material layer 12; a metal or metal alloy source contact layer 18 located over a back side of the doped single crystalline semiconductor material layer 12; a dielectric isolation layer 16 located over a front side of the doped single crystalline semiconductor material layer 12; an alternating stack of insulating layers 32 and electrically conductive layers 46 located over the dielectric isolation layer 16; a memory opening 49 vertically extending through the alternating stack (32, 46) and the dielectric isolation layer 16 and at least partially through the doped single crystalline semiconductor material layer 12; a memory film 50 and a vertical semiconductor channel (60, 260) located within the memory opening 49, wherein the vertical semiconductor channel (60, 260) vertically extends through the dielectric isolation layer 16 and into the doped single crystalline semiconductor material layer 12; and a single crystalline semiconductor pedestal 64 contacting the doped single crystalline semiconductor material layer 12 and the vertical semiconductor channel (60, 260).

In one embodiment, the single crystalline semiconductor pedestal 64 comprises a coreless epitaxial semiconductor pedestal 64 comprising a cylindrical epitaxial semiconductor portion 64C and an annular laterally-protruding portion 64L having a greater lateral extent than the cylindrical epitaxial semiconductor portion 64C, wherein the coreless epitaxial semiconductor pedestal 64 comprises a cylindrical inner sidewall that extends through the cylindrical epitaxial semiconductor portion 64C and through the annular laterally-protruding portion 64L and contacts the vertical semiconductor channel (60, 260), and wherein the cylindrical epitaxial semiconductor portion 64C comprises a cylindrical outer sidewall that contacts the doped single crystalline semiconductor material layer 12.

In one embodiment, the annular laterally-protruding portion 64L comprises an annular horizontal surface having an inner periphery that is adjoined to a closed edge of the cylindrical outer sidewall. In one embodiment, the annular laterally-protruding portion 64L comprises a convex or faceted surface that is adjoined to an outer periphery of the annular horizontal surface of the annular laterally-protruding portion. In one embodiment, the convex or faceted surface of the annular laterally-protruding portion contacts the dielectric isolation layer 16.

In one embodiment, a periphery of an interface between the annular laterally-protruding portion 64L and the dielectric isolation layer 16 is in contact with an insulating layer 32 (such as the bottommost insulating layer 32) within the alternating stack (32, 46). In one embodiment, the dielectric isolation layer 16 embeds at least one airgap 16A.

In one embodiment, the memory film 50 is vertically spaced from the coreless epitaxial semiconductor pedestal 64 by a portion of the vertical semiconductor channel (60, 260) that directly contacts a sidewall surface of one of the insulating layers 32 (such as the bottommost insulating layer 32) within the alternating stack (32, 46). In one embodiment, an interface between the vertical semiconductor channel (60, 260) and the one of the insulating layers 32 (such as the bottommost insulating layer 32) within the alternating stack (32, 46) is vertically coincident with an interface between the memory film 50 and the alternating stack (32, 46).

In one embodiment, the vertical semiconductor channel 60 comprises a single crystalline semiconductor material that continuously extends through each electrically conductive layer 46 within the alternating stack (32, 46). In one embodiment, the single crystalline semiconductor material of the vertical semiconductor channel 60 is in epitaxial alignment with a single crystalline semiconductor material of the coreless epitaxial semiconductor pedestal 64. In one embodiment, the vertical semiconductor channel 60 embeds a void 60V between a first horizontal plane including a proximal horizontal surface of the doped single crystalline semiconductor material layer 12 that is proximal to the alternating stack (32, 46) and a second horizontal plane including a distal horizontal surface of the doped single crystalline semiconductor material layer 12 this is distal from the alternating stack (32, 46).

In one embodiment, a drain region 63 can be located at an end of the vertical semiconductor channel 60 that is distal from the doped single crystalline semiconductor material layer 12. In one embodiment, the drain region 63 is single crystalline and is in epitaxial alignment with the single crystalline semiconductor material of the vertical semiconductor channel 60.

In one embodiment, the vertical semiconductor channel 60 comprises a single crystalline silicon channel, the doped single crystalline semiconductor material layer 12 comprises a doped single crystalline silicon layer, the metal or metal alloy source contact layer 18 comprises an aluminum layer which contacts the back side of the doped single crystalline silicon layer 12, and the coreless epitaxial semiconductor pedestal 64 comprises a single crystalline silicon pedestal.

In one embodiment, the vertical semiconductor channel 260 comprises a polycrystalline or amorphous semiconductor material (e.g., polysilicon) that continuously extends through each electrically conductive layer 46 within the alternating stack (32, 46). In one embodiment, a dielectric core 62 can vertically extend through the alternating stack (32, 46), the dielectric isolation layer 160, and a portion of the doped single crystalline semiconductor material layer 12 that is proximal to the dielectric isolation layer 16, and can be laterally surrounded by the vertical semiconductor channel 260.

The various embodiments of the present disclosure provide an epitaxial semiconductor pedestal 64 that functions as a high-conductivity contact structure between the doped single crystalline semiconductor material layer 12 and the vertical semiconductor channel (60, 260). A top source contact 18 may be provided on the back side of layer 12 to simplify the method of making the embodiment device. Some embodiments of the present disclosure provide single crystalline vertical semiconductor channels 60, which can further enhance the device speed.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure, comprising:
   a doped single crystalline semiconductor material layer;
   a metal or metal alloy source contact layer located over a back side of the doped single crystalline semiconductor material layer;
   a dielectric isolation layer located over a front side of the doped single crystalline semiconductor material layer;
   an alternating stack of insulating layers and electrically conductive layers located over the dielectric isolation layer;
   a memory opening vertically extending through the alternating stack and the dielectric isolation layer and at least partially through the doped single crystalline semiconductor material layer;
   a memory film and a vertical semiconductor channel located within the memory opening, wherein the vertical semiconductor channel vertically extends through the dielectric isolation layer and into the doped single crystalline semiconductor material layer; and a single crystalline semiconductor pedestal contacting the doped single crystalline semiconductor material layer and the vertical semiconductor channel;

wherein the single crystalline semiconductor pedestal comprises a coreless epitaxial semiconductor pedestal comprising a cylindrical epitaxial semiconductor portion and an annular laterally-protruding portion having a greater lateral extent than the cylindrical epitaxial semiconductor portion, wherein the coreless epitaxial semiconductor pedestal comprises a cylindrical inner sidewall that extends through the cylindrical epitaxial semiconductor portion and through the annular laterally-protruding portion and contacts the vertical semiconductor channel, and wherein the cylindrical epitaxial semiconductor portion comprises a cylindrical outer sidewall that contacts the doped single crystalline semiconductor material layer.

2. The semiconductor structure of claim 1, wherein the annular laterally-protruding portion comprises an annular horizontal surface having an inner periphery that is adjoined to a closed edge of the cylindrical outer sidewall.

3. The semiconductor structure of claim 2, wherein the annular laterally-protruding portion comprises a convex or faceted surface that is adjoined to an outer periphery of the annular horizontal surface of the annular laterally-protruding portion.

4. The semiconductor structure of claim 3, wherein the convex or faceted surface of the annular laterally-protruding portion contacts the dielectric isolation layer.

5. The semiconductor structure of claim 1, wherein a periphery of an interface between the annular laterally-protruding portion and the dielectric isolation layer is in contact with an insulating layer within the alternating stack.

6. The semiconductor structure of claim 1, wherein the memory film is vertically spaced from the coreless epitaxial semiconductor pedestal by a portion of the vertical semiconductor channel that directly contacts a sidewall surface of one of the insulating layers within the alternating stack.

7. The semiconductor structure of claim 6, wherein an interface between the vertical semiconductor channel and the one of the insulating layers within the alternating stack is vertically coincident with an interface between the memory film and the alternating stack.

8. The semiconductor structure of claim 1, wherein the vertical semiconductor channel comprises a single crystalline semiconductor material that continuously extends through each electrically conductive layer within the alternating stack.

9. The semiconductor structure of claim 8, wherein the single crystalline semiconductor material of the vertical semiconductor channel is in epitaxial alignment with a single crystalline semiconductor material of the coreless epitaxial semiconductor pedestal.

10. The semiconductor structure of claim 8, wherein:
the vertical semiconductor channel comprises a single crystalline silicon channel;
the doped single crystalline semiconductor material layer comprises a doped single crystalline silicon layer;
the metal or metal alloy source contact layer comprises an aluminum layer which contacts the back side of the doped single crystalline silicon layer; and
the coreless epitaxial semiconductor pedestal comprises a single crystalline silicon pedestal.

11. The semiconductor structure of claim 8, further comprising a drain region located at an end of the vertical semiconductor channel that is distal from the doped single crystalline semiconductor material layer.

12. The semiconductor structure of claim 1, wherein:
the vertical semiconductor channel comprises a polysilicon channel;
the doped single crystalline semiconductor material layer comprises a doped single crystalline silicon layer;
the metal or metal alloy source contact layer comprises an aluminum layer which contacts the back side of the doped single crystalline silicon layer; and
the coreless epitaxial semiconductor pedestal comprises a single crystalline silicon pedestal.

13. The semiconductor structure of claim 12, further comprising a dielectric core vertically extending through the alternating stack, the dielectric isolation layer, and a portion of the doped single crystalline semiconductor material layer that is proximal to the dielectric isolation layer, and laterally surrounded by the vertical semiconductor channel.

14. The semiconductor structure of claim 1, further comprising a logic die comprising a peripheral circuitry bonded to the alternating stack.

* * * * *